(12) United States Patent
Miyai et al.

(10) Patent No.: US 10,088,705 B2
(45) Date of Patent: Oct. 2, 2018

(54) METHOD FOR PRODUCING POLARIZING FILM

(71) Applicant: NITTO DENKO CORPORATION, Ibaraki-shi, Osaka (JP)

(72) Inventors: Emi Miyai, Osaka (JP); Kentaro Ikeshima, Osaka (JP); Toshiki Omine, Osaka (JP); Satoshi Mita, Osaka (JP); Atsushi Kishi, Osaka (JP); Tomonori Ueno, Osaka (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/515,885

(22) PCT Filed: Sep. 29, 2015

(86) PCT No.: PCT/JP2015/077578
§ 371 (c)(1),
(2) Date: Mar. 30, 2017

(87) PCT Pub. No.: WO2016/052538
PCT Pub. Date: Apr. 7, 2016

(65) Prior Publication Data
US 2017/0299919 A1 Oct. 19, 2017

(30) Foreign Application Priority Data

Sep. 30, 2014 (JP) .................................. 2014-202623
Sep. 30, 2014 (JP) .................................. 2014-202624
(Continued)

(51) Int. Cl.
*G02F 1/1335* (2006.01)
*G02B 1/11* (2015.01)
(Continued)

(52) U.S. Cl.
CPC ........ *G02F 1/133528* (2013.01); *B23B 27/00* (2013.01); *B23B 37/00* (2013.01);
(Continued)

(58) Field of Classification Search
CPC ......... G02F 1/133528; G02F 1/133632; G02B 1/11; G02B 1/14; G02B 1/16; G02B 5/3033; C23C 16/509
(Continued)

(56) References Cited

U.S. PATENT DOCUMENTS 9,703,025 B2 * 7/2017 Kunai .................. G02B 5/3033
9,740,044 B2 * 8/2017 Kawamura ....... G02F 1/133528
(Continued)

FOREIGN PATENT DOCUMENTS

| CN | 1550798 A | 12/2004 |
|---|---|---|
| CN | 1774654 A | 5/2006 |

(Continued)

OTHER PUBLICATIONS

Office Action dated May 9, 2017, issued in counterpart Taiwanese application No. 104132127, with English translation. (6 pages).
(Continued)

*Primary Examiner* — Frank Font
(74) *Attorney, Agent, or Firm* — Westerman, Hattori, Daniels & Adrian, LLP

(57) ABSTRACT

A method for producing a polarizing film includes (1) preparing a laminate (a) which includes a carrier film and a polarizer with a thickness of 10 μm or less formed on one surface of the carrier film and contains a polyvinyl alcohol-based resin; (2) peeling off the carrier film from the laminate (a); and (3) applying a liquid material to a side of the laminate (a) from which the carrier film has been peeled off and then solidifying or curing the liquid material to form a transparent resin layer with a thickness of 0.2 μm or more,
(Continued)

wherein the liquid material contains a resin component or a curable component capable of forming a resin layer. This production method enables the achievement of a polarizing film which is able to have satisfactory durability in a heated environment even in cases where a thin polarizer is used therefor.

12 Claims, 2 Drawing Sheets

(30) Foreign Application Priority Data

| Feb. 13, 2015 | (JP) | ................................ | 2015-026586 |
|---|---|---|---|
| Aug. 27, 2015 | (JP) | ................................ | 2015-167695 |
| Sep. 28, 2015 | (JP) | ................................ | 2015-189273 |
| Sep. 28, 2015 | (JP) | ................................ | 2015-189275 |
| Sep. 28, 2015 | (JP) | ................................ | 2015-189276 |
| Sep. 28, 2015 | (JP) | ................................ | 2015-189278 |

(51) Int. Cl.
| | |
|---|---|
| C23C 16/509 | (2006.01) |
| G02B 5/30 | (2006.01) |
| G02F 1/13363 | (2006.01) |
| B23B 37/00 | (2006.01) |
| B23B 27/00 | (2006.01) |

(52) U.S. Cl.
CPC .............. *C23C 16/509* (2013.01); *G02B 1/11* (2013.01); *G02B 5/3033* (2013.01); *G02F 1/133632* (2013.01); *G02F 2413/10* (2013.01)

(58) Field of Classification Search
USPC .................. 359/487.01, 487.02, 900; 349/96
See application file for complete search history.

(56) References Cited

U.S. PATENT DOCUMENTS

| 9,857,625 | B2* | 1/2018 | Kunai .................. G02B 5/3033 |
|---|---|---|---|
| 2006/0182896 | A1 | 8/2006 | Murakami et al. |
| 2006/0227423 | A1 | 10/2006 | Saiki et al. |
| 2007/0207277 | A1 | 9/2007 | Mizushima et al. |
| 2008/0137187 | A1 | 6/2008 | Nishida et al. |
| 2009/0091826 | A1 | 4/2009 | Sugino |
| 2009/0122401 | A1 | 5/2009 | Shinagawa et al. |
| 2010/0221455 | A1 | 9/2010 | Kim et al. |
| 2011/0043733 | A1 | 2/2011 | Suzuki et al. |
| 2011/0163281 | A1 | 7/2011 | Bae et al. |
| 2012/0055607 | A1 | 3/2012 | Kitagawa et al. |
| 2012/0055608 | A1 | 3/2012 | Kitagawa et al. |
| 2012/0055621 | A1 | 3/2012 | Goto et al. |
| 2012/0055622 | A1 | 3/2012 | Kitagawa et al. |
| 2012/0055623 | A1 | 3/2012 | Kitagawa et al. |
| 2012/0056211 | A1 | 3/2012 | Kitagawa et al. |
| 2012/0056340 | A1 | 3/2012 | Kitagawa et al. |
| 2012/0057104 | A1 | 3/2012 | Kitagawa et al. |
| 2012/0057231 | A1 | 3/2012 | Goto et al. |
| 2012/0058291 | A1 | 3/2012 | Kitagawa et al. |
| 2012/0058321 | A1 | 3/2012 | Goto et al. |
| 2012/0206804 | A1 | 8/2012 | Nam et al. |
| 2013/0135729 | A1* | 5/2013 | Hirata .................. B29D 11/0073 359/492.01 |
| 2013/0220525 | A1 | 8/2013 | Kunai |
| 2014/0057060 | A1* | 2/2014 | Fukagawa ......... G02F 1/133528 428/1.31 |
| 2014/0065429 | A1 | 3/2014 | Kunikata et al. |
| 2014/0285887 | A1 | 9/2014 | Goto et al. |
| 2015/0070761 | A1 | 3/2015 | Kitagawa et al. |
| 2015/0301252 | A1 | 10/2015 | Nam et al. |
| 2015/0309234 | A1 | 10/2015 | Nam et al. |
| 2016/0363699 | A1 | 12/2016 | Kunai |

FOREIGN PATENT DOCUMENTS

| CN | 1860389 A | 11/2006 |
|---|---|---|
| CN | 101228462 A | 7/2008 |
| CN | 101387718 A | 3/2009 |
| CN | 101692133 A | 4/2010 |
| CN | 102834748 A | 12/2012 |
| JP | 9-104478 A | 4/1997 |
| JP | 10-308198 A | 11/1998 |
| JP | 2000-338329 A | 12/2000 |
| JP | 2001-343521 A | 12/2001 |
| JP | 2003-121618 A | 4/2003 |
| JP | 2004-61565 A | 2/2004 |
| JP | 2004-223993 A | 8/2004 |
| JP | 2005-43858 A | 2/2005 |
| JP | 2005-84113 A | 3/2005 |
| JP | 2009-169333 A | 7/2009 |
| JP | 2009-211057 A | 9/2009 |
| JP | 2010-9027 A | 1/2010 |
| JP | 2011-221185 A | 11/2011 |
| JP | 2011-221278 A | 11/2011 |
| JP | 2011-227450 A | 11/2011 |
| JP | 2013-33084 A | 2/2013 |
| JP | 2013-68804 A | 4/2013 |
| JP | 2013-72951 A | 4/2013 |
| JP | 2013-160775 A | 8/2013 |
| JP | 2013-254072 A | 12/2013 |
| JP | 2014-59547 A | 4/2014 |
| JP | 5504232 B2 | 5/2014 |
| JP | 2014-119501 A | 6/2014 |
| JP | 2014-182321 A | 9/2014 |
| JP | 2014-206725 A | 10/2014 |
| JP | 2015-161782 A | 9/2015 |
| KP | 10-2011-0078782 A | 7/2011 |
| KR | 10-2006-0009837 A | 2/2006 |
| KR | 10-2010-0097076 A | 9/2010 |
| KR | 10-2012-0099172 A | 9/2012 |
| KR | 10-1326205 B1 | 1/2013 |
| KR | 10-2013-0018227 A | 2/2013 |
| KR | 10-2014-074260 A | 6/2014 |
| KR | 10-2014-0114733 A | 9/2014 |
| TW | 201430405 A | 8/2014 |
| TW | 201434643 A | 9/2014 |
| WO | 2009/099049 A1 | 8/2009 |
| WO | 2009/145150 A1 | 12/2009 |
| WO | 2011/125958 A1 | 10/2011 |
| WO | 2014/077599 A1 | 5/2014 |
| WO | 2014/077636 A1 | 5/2014 |
| WO | 2014/091894 A1 | 6/2014 |
| WO | 2015/194523 A1 | 12/2015 |

OTHER PUBLICATIONS

International Search Report dated Dec. 22, 2015, issued in counterpart application No. PCT/JP2015/077578. (2 pages).

Notification of Reasons for Refusal dated Aug. 23, 2016, issued in counterpart Japanese Patent Application No. 2015-189273, w/English translation (8 pages).

Notification of Reasons for Refusal dated Aug. 23, 2016, issued in counterpart Japanese Patent Application No. 2015-189276, w/English translation (8 pages).

Notification of Reasons for Refusal dated Aug. 23, 2016, issued in counterpart Japanese Patent Application No. 2015-189278, w/English translation (13 pages).

Decision to Grant a Patent dated Sep. 6, 2016, issued in counterpart Japanese Patent Application No. 2015-189275, w/English translation (6 pages).

Notification of Transmittal of Translation of the International Preliminanry Report on Patentability (Form PCT/IB/338) issued in counterpart International Application No. PCT/JP2015/077578 dated Apr. 13, 2017, with Forms PCT/IB/373 and PCT/ISA/237. (9 pages).

Office Action dated Oct. 27, 2017, issued in counterpart Korean Application No. 10-2017-7009611, with English translation (7 pages).

Office Action dated Nov. 9, 2017, issued in Korean Application No. 10-2017-7009610, with English translation (7 pages).

(56) References Cited

OTHER PUBLICATIONS

Office Action dated Oct. 27, 2017, issued in to Korean Application No. 10-2017-7009090, with English translation (9 pages).
Office Action dated Oct. 10, 2017, issued in counterpart Chinese Application No. 201580053060.2, with English translation (11 pages).
Office Action dated Oct. 16, 2017, issued in Chinese Application No. 201580053076.3 , with English translation (11 pages).
Office Action dated Oct. 27, 2017, issued in Korean Application No. 10-2017-7008777, with English translation (4 pages).
Office Action dated Jan. 3, 2018 , issued in Chinese application No. 201580053067.4 which is counterpart to related U.S. Appl. No. 15/515,887, with English translation. (13 pages).
Notice of Allowance dated Feb. 27, 2018, issued in Korean application No. 10-2017-7009090 which is counterpart to related U.S. Appl. No. 15/515,385 (3 pages).
Office Action dated Feb. 26, 2018, issued in counterpart Korean application No. 10-2017-7009611 (7 pages) with machine translation.
Office Action dated Mar. 20, 2018, issued in Chinese Application No. 201580053076.3, which is counterpart to related U.S. Appl. No. 15/515,890, with English translation. (16 pages).
Notice of Allowance dated Mar. 28, 2018, issued in Korean Application No. 10-2017-7009610, which is counterpart to related to U.S. Appl. No. 15/515,890, with English translation. (5 pages).
Office Action dated Mar. 21, 2018, issued in Chinese Application No. 201580053094.1, with English translation. (15 pages).
Notice of Allowance dated Jun. 21, 2018, issued in Korean Patent Application No. 10-2017-7009611 (3 pages).

\* cited by examiner

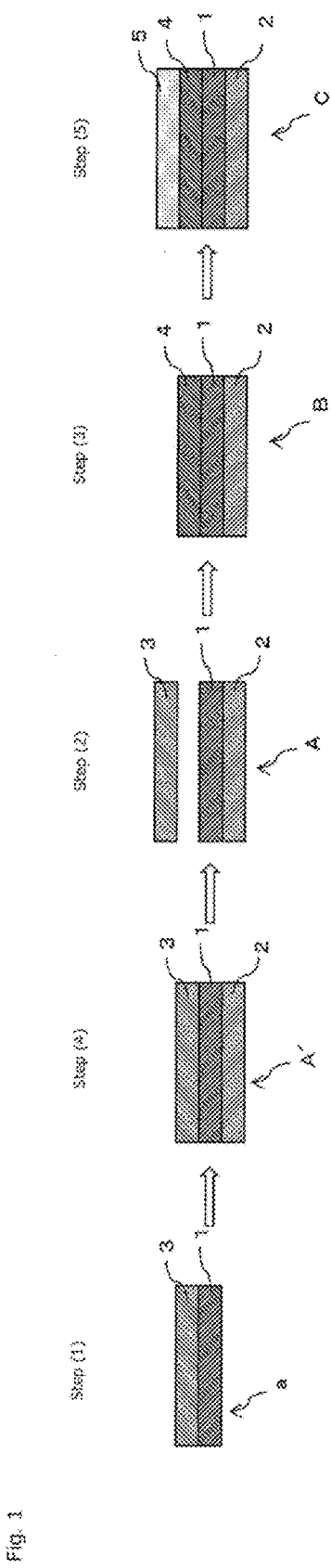

METHOD FOR PRODUCING POLARIZING FILM

TECHNICAL FIELD

The invention relates to a method for producing a polarizing film. The polarizing film to be used may include a polarizer and a protective film provided on at least one surface of the polarizer. A pressure-sensitive adhesive layer may be further provided on the polarizing film to form a pressure-sensitive-adhesive-layer-attached polarizing film for use. The polarizing film may be used alone or as a component of a multilayer optical film to form an image display device such as a liquid crystal display (LCD) or an organic electroluminescent (EL) display.

BACKGROUND ART

The liquid crystal display market has experienced rapid growth in many applications such as clocks, cellular phones, personal digital assistants (PDAs), notebook PCs, PC monitors, DVD players, and TVs. Liquid crystal display devices use liquid crystal switching to visualize the polarization state, and on the basis of the display principle, they use polarizers.

For example, iodine-based polarizers composed of stretched polyvinyl alcohol and iodine adsorbed thereto are most popular polarizers widely used because of their high transmittance and high degree of polarization. Such polarizers have disadvantages such as extremely weak mechanical strength and heat or water shrinkability, which can cause a significant reduction in polarizing function. Therefore, immediately after produced, a polarizer is bonded to an adhesive-coated protective film with the adhesive interposed therebetween, and the resulting polarizing film is used for applications.

On the other hand, as image display devices such as liquid crystal display devices have been reduced in thickness, polarizing films have also been required to be thin. In the process of producing a thin polarizer, the polarizer can be damaged because of its small thickness. Therefore, a carrier film (removable protective film) is used in the production of a thin polarizer. For example, a thin polarizer can be formed on such a carrier film by stretching and dyeing a laminate including the carrier film and a polyvinyl alcohol-based resin layer formed on one side of the carrier film (Patent Documents 1 to 6). A one-side-protected polarizing film can also be used, which includes a polarizer and a protective film provided on only one side of the polarizer, being free of any protective film on the other side. Such a one-side-protected polarizing film can be thinner than a double-side-protected polarizing film including a polarizer and protective films provided on both surfaces of the polarizer, because the former has one less protective film than the latter.

PRIOR ART DOCUMENTS

Patent Documents

Patent Document 1: JP-A-2000-338329
Patent Document 2: JP-A-2001-343521
Patent Document 3: JP-A-2011-227450
Patent Document 4: JP-A-2013-033084
Patent Document 5: WO2014/077599
Patent Document 6: WO2014/077636

SUMMARY OF THE INVENTION

Problems to be Solved by the Invention

Liquid crystal display devices are required to have durability that allows them to maintain optical properties even under harsh conditions at high temperature. Polarizing films produced with the thin polarizer mentioned above are also required to have such durability.

When the thin polarizer obtained by the production method described in Patent Documents 1 to 6 is subjected to practical use, the carrier film is usually peeled off from the polarizer. When a one-side-protected polarizing film is produced using the thin polarizer, for example, a protective film is placed on the polarizer with an adhesive interposed therebetween, and then the carrier film is peeled off from the polarizer, so that a one-side-protected polarizing film is obtained. When such a one-side-protected polarizing film is used, for example, a pressure-sensitive adhesive layer is placed on the polarizer side of the one-side-protected polarizing film without any modification.

However, it has been found that in the production method mentioned above, the step of peeling off the carrier film from the polarizer can cause a surface portion of the polarizer to be removed together with the carrier film or cause the polarizer to crack due to the shock resulting from the peeling off of the carrier film, so that the polarizer can suffer from damages (appearance defects), which can be manifested as visible light-leakage defects in a heated environment. The problem of the occurrence of light leakage at damaged portions in a heated environment can easily occur particularly in the one-side-protected polarizing film having the thin polarizer obtained by the production method described in Patent Documents 1 to 6, because it has no protective film on the carrier film side. Thus, none of the thin polarizer obtained by the production method mentioned above and the one-side-protected polarizing film produced with the thin polarizer have a satisfactory level of the durability.

It is an object of the invention to provide a method for producing, with a thin polarizer, a polarizing film having a satisfactory level of durability even in a heated environment.

Means for Solving the Problems

As a result of intensive studies, the inventors have accomplished the invention based on findings that the problems can be solved by the method for producing a polarizing film described below.

That is, the present invention relates to a method for producing a polarizing film, the method comprising the steps of:

—(1) providing a laminate (a) comprising a carrier film and a polarizer with a thickness of 10 μm or less formed on one surface of the carrier film and comprising a polyvinyl alcohol-based resin;

(2) peeling off the carrier film from the laminate (a); and (3) applying a liquid material to a side of the laminate (a) from which the carrier film has been peeled off and then solidifying or curing the liquid material to form a transparent resin layer with a thickness of 0.2 μm or more, wherein the liquid material contains a resin component or a curable component capable of forming a resin layer.

In the method for producing a polarizing film, the transparent resin layer preferably has an 80° C. compressive elastic modulus of 0.1 GPa or more.

In the method for producing a polarizing film, in the step (3), the liquid material preferably contains the resin component dissolved or dispersed in water, and the transparent resin layer is preferably formed by applying the liquid material and then solidifying the liquid material.

In the method for producing a polarizer film, the liquid material containing the resin component is preferably an aqueous solution containing a polyvinyl alcohol-based resin.

In the method for producing a polarizing film, the liquid material preferably has a viscosity of 1,000 mPa·s or less at 25° C.

In the method for producing a polarizing film, the laminate (a) in the step (1) is preferably a product obtained by performing at least a stretching step and a dyeing step on a laminate (a') including a carrier film and a polyvinyl alcohol-based resin layer formed on one surface of the carrier film.

The method for producing a polarizing film may include the step (4) of forming a protective film on the polarizer side of the laminate (a), and the method may produce, as the polarizing film, a one-side-protected polarizing film having the protective film provided on only one side of the polarizer.

In the method for producing a polarizing film, the polarizer preferably has a single-body transmittance T and a polarization degree P representing optical properties in the range represented by the following formula: $P>-(10^{0.929T-42.4}-1)\times100$ (provided that $T<42.3$) or $P\geq99.9$ (provided that $T\geq42.3$).

The method for producing a polarizing film may include the step (5) of further forming a pressure-sensitive adhesive layer on the side of the transparent resin layer formed in the step (3), and the method may produce a pressure-sensitive-adhesive-layer-attached polarizing film.

Effect of the Invention

In the method of the invention for producing a polarizing film, a transparent resin layer with a thickness of 0.2 μm or more is formed on the surface of the polarizer after the carrier film is peeled off from the laminate (a) including the carrier film and the polarizer with a thickness of 10 μm or less formed on one surface of the carrier film. Such a transparent resin layer can repair damages occurring at the surface of the thin polarizer to prevent the polarizer from having appearance defects.

In the polarizing film obtained by the production method of the invention, the transparent resin layer provided on the surface of the polarizer can suppress expansion of damages in the polarizer even under heating conditions. Thus, even when placed in a heated environment, the polarizing film obtained by the production method of the invention can resist light leakage, which would otherwise be caused by the damages, and exhibit a satisfactory level of durability.

In the production method of the invention, the transparent resin layer provided on the thin polarizer is effective in terms of the durability when having an 80° C. compressive elastic modulus of 0.1 GPa or more. The transparent resin layer (with an 80° C. compressive elastic modulus of 0.1 GPa or more) is preferable in order to achieve thickness reduction and prevent light-leakage defects, which would otherwise be caused by damages occurring in the polarizer.

BRIEF DESCRIPTION OF THE DRAWINGS

FIG. 1 is a schematic diagram illustrating an exemplary embodiment of the method of the invention for producing a polarizing film.

MODE FOR CARRYING OUT THE INVENTION

Figure 2A:
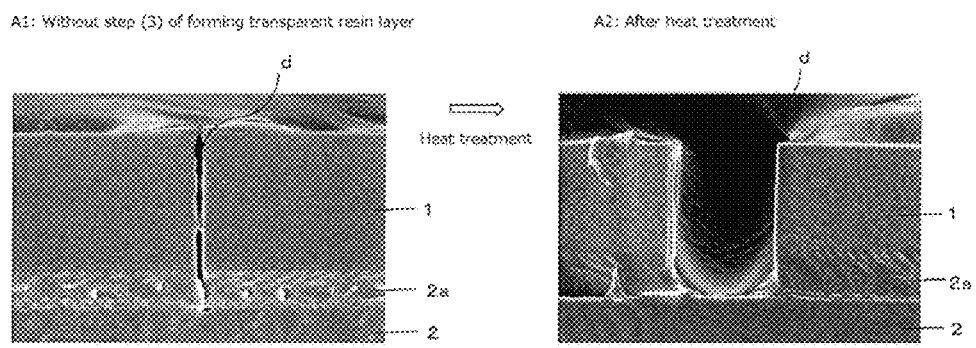
FIGS. 2A(A1) and 2A(A2) are photographs showing the cross-section of a one-side-protected polarizing film before and after a heat treatment performed before the step (3) of forming a transparent resin layer.

Hereinafter, the steps (1) to (5) of the method of the invention for producing a polarizing film will be described with reference to FIG. 1. In the method of the invention for producing a polarizing film, the steps (2) and (3) are sequentially performed after the step (1) of providing a laminate (a) including a thin polarizer 1 and a carrier film 3. The laminate (a) can easily break during feeding. As shown in FIG. 1, therefore, performing the step (2) on the laminate (a) is preferably preceded by the step (4) of providing a protective film 2 on the polarizer 1 side of the laminate (a) to form a carrier film-attached one-side-protected polarizing film A'. FIG. 1 shows that the step (4) is followed by the step (2) of peeling off the carrier film 3 from the carrier film-attached one-side-protected polarizing film A' to produce a one-side-protected polarizing film A, which is followed by the step (3) to produce a transparent resin layer-attached one-side-protected polarizing film B. As shown in FIG. 1, the transparent resin layer-attached one-side-protected polarizing film B includes the polarizer 1, the protective film 2 provided on only one surface of the polarizer 1, and a transparent resin layer 4 placed (directly) on the other surface of the polarizer 1.

As shown in FIG. 1, the step (5) of providing a pressure-sensitive adhesive layer 5 on the transparent resin layer 4 of the transparent resin layer-attached one-side-protected polarizing film B may be performed to produce a pressure-sensitive-adhesive-layer-attached polarizing film C. In the step (5), the pressure-sensitive adhesive layer 5 may be provided on the transparent resin layer 4 side and/or the protective film 2 side of the transparent resin layer-attached one-side-protected polarizing film B. In this regard, FIG. 1 shows an example of the step (5) where the pressure-sensitive adhesive layer 5 is provided on the transparent resin layer 4 side of the transparent resin layer-attached one-side-protected polarizing film B.

FIGS. 2A(A1) and 2A(A2) are photographs of the cross-section of the one-side-protected polarizing film A before the step (3) of forming the transparent resin layer 4. FIG. 2A(A1) shows that the polarizer 1 suffers from a damage d resulting from the step (2) of peeling off the carrier film 3. FIG. 2 (A2) is a photograph showing the cross-section of the one-side-protected polarizing film A obtained after storage in a heated environment. FIG. 2A(A2) shows that the damage d in the polarizer 1 is expanded by the heating.

Figure 2B:
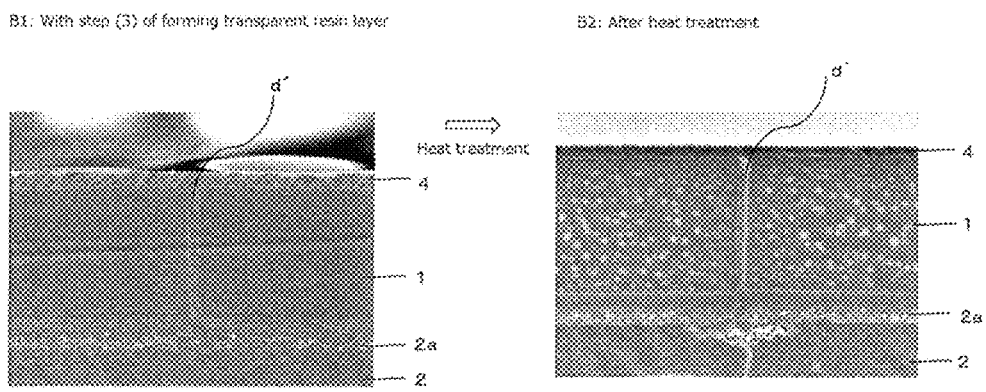
FIGS. 2B(B1) and 2B(B2) are photographs showing the cross-section of a transparent resin layer-attached one-side-protected polarizing film before and after a heat treatment performed after the step (3) of forming a transparent resin layer.

FIGS. 2B(B1) and 2B(B2) are photographs of the cross-section of the transparent resin layer-attached one-side-protected polarizing film B obtained after the step (3) of forming the transparent resin layer 4. FIG. 2B (B1) shows that a damage d, which has occurred in the polarizer 1 as a result of the step (2) of peeling off the carrier film 3, is repaired (d') by the transparent resin layer 4. FIG. 2(2B) is a photograph showing the cross-section of the transparent resin layer-attached one-side-protected polarizing film B obtained after a heat treatment. FIG. 2B(B2) shows that the damage d in the polarizer 1 is sufficiently repaired (d') without being expanded even after the heat treatment.

<Step (1)>

The step (1) includes providing a laminate (a) including a carrier film 3 and a polarizer 1 with a thickness of 10 μm or less formed on one surface of the carrier film 3. The laminate (a) only has to have a polarizer 1 with a thickness of 10 μm or less provided on at least one surface of the carrier film 3. The laminate (a) may have polarizers 1 on both surfaces of the carrier film 3.

<<Laminate (a)>>

The laminate (a) can be obtained by, for example, performing at least a stretching step and a dyeing step on a laminate (a') including a carrier film and a polyvinyl alcohol-based resin (hereinafter also referred to as PVA-based resin) layer formed on one surface of the carrier film. The carrier film used may be a long film, which makes it possible to form a long PVA-based resin layer and thus is advantageous for continuous production.

<<Carrier Film>>

The carrier film used may be any of various thermoplastic resin films. Examples of materials that may be used to form thermoplastic resin films include ester-based resins such as polyethylene terephthalate-based resins, cycloolefin-based resins such as norbornene-based resins, olefin-based resins such as polyethylene and polypropylene, polyamide-based resins, polycarbonate-based resins, and copolymerized resins thereof. Among them, ester-based resins are preferred in view of ease of production and reduction in costs. A thermoplastic ester-based resin film may be used, which may be a thermoplastic amorphous ester-based resin film or a thermoplastic crystalline ester-based resin film. A relatively thick thermoplastic resin film is preferred for prevention of breakage during the stretching step and for ease of the feeding of the laminate (a). In general, the thickness of the thermoplastic resin film is preferably from 20 to 200 μm, more preferably from 30 to 150 μm, before the stretching step.

The carrier film may also be a laminate including the thermoplastic resin film and a pressure-sensitive adhesive removably provided thereon. The pressure-sensitive adhesive layer may be similar to that used for removable surface protective films or other films.

<<Thin Polarizer>>

The polarizer in the laminate (a) includes a polyvinyl alcohol-based resin and has a thickness of 10 μm or less. In view of thickness reduction, the polarizer preferably has a thickness of 8 μm or less, more preferably 7 μm or less, even more preferably 6 μm or less. On the other hand, the polarizer preferably has a thickness of 2 μm or more, more preferably 3 μm or more. The polarizer with such a small thickness can be easily damaged during the peeling off of the carrier film from the laminate (a). On the other hand, the thin polarizer is less uneven in thickness, has good visibility, and is less dimensionally-variable and thus has high durability to thermal shock.

In view of stretching stability and optical durability, the polarizer preferably contains boric acid. In order to make the polarizer resistant to cracking in a heat cycle test (cycles of −40° C. and 80° C.) and resistant to damage during the peeling off of the carrier film, the content of boric acid in the polarizer is preferably 25% by weight or less, more preferably 20% by weight or less, even more preferably 18% by weight or less, further more preferably 16% by weight or less, based on the total weight of the polarizer. If the content of boric acid in the polarizer is more than 20% by weight, shrinkage stress in the polarizer can increase to make cracks more likely to occur even when the thickness of the polarizer is controlled to 10 μm or less, which is not preferred. On the other hand, in view of the stretching stability and optical durability of the polarizer, the boron content is preferably 10% by weight or more, more preferably 12% by weight or more, based on the total weight of the polarizer.

Typical examples of the thin polarizer include the thin polarizers described in, for example, JP-B1-4751486, JP-B1-4751481, JP-B1-4815544, JP-B1-5048120, WO 2014/077599 A, and WO 2014/077636 A or thin polarizers obtained by the production methods described in these publications.

The polarizer is preferably designed to have a single-body transmittance T and a polarization degree P that represent optical properties satisfying the condition of the following formula: $P > -(10^{0.929T-42.4} - 1) \times 100$ (provided that T<42.3) or P≥99.9 (provided that T≥42.3). The polarizer designed to satisfy the condition uniquely has the performance required for a liquid crystal television display having a large display element. Specifically, such a display is required to have a contrast ratio of 1,000:1 or more and a maximum brightness of 500 cd/m² or more. In other applications, for example, the polarizer is bonded to the viewer side of an organic EL display device.

On the other hand, the polarizer including a polyvinyl alcohol-based resin designed to satisfy the condition includes a polyvinyl alcohol-based molecule having high orientation, which causes, together with the thickness of 10 μm or less, a significant reduction in the tensile rupture stress in the direction perpendicular to the absorption axis direction of the polarizer. As a result, in the step (2), the surface of the polarizer can be easily damaged during the peeling off of the carrier film from the carrier film-attached one-side-protected polarizing film. Thus, the invention is particularly advantageous for the one-side-protected polarizing film having the polarizer described above.

The thin polarizer described above should be produced by a process capable of achieving high-ratio stretching to improve polarizing performance, among processes including the steps of stretching and dyeing a laminate (a'). From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These thin polarizers can be obtained by a process including the steps of stretching a laminate of a polyvinyl alcohol-based resin (hereinafter also referred to as PVA-based resin) layer and a stretchable resin substrate and dyeing the laminate. Using this process, the PVA-based resin layer, even when thin, can be stretched without problems such as breakage by stretching, because the layer is supported on the stretchable resin substrate.

The laminate (a') can be formed by, for example, applying an aqueous solution of a PVA-based resin to the carrier film and then drying the solution. Alternatively, the PVA-based resin layer for the laminate (a') may be formed by extrusion on the carrier film. Alternatively, the PVA-based resin layer may also be formed by stacking a PVA-based resin film, which has been prepared in advance, on the carrier film. The thickness of the PVA-based resin layer is so appropriately selected taking into account the stretch ratio and other conditions that a polarizer with a thickness of 10 μm or less can be obtained after the stretching. If the PVA-based resin film is dyed in advance, the laminate (a') can be obtained without being subjected to a dyeing step.

The stretching step is preferably performed on the laminate (a'), for example, in such a manner that the PVA-based resin layer is stretched to a total stretch ratio in the range of 3 to 10 times. The total stretch ratio is preferably from 4 to 8 times, more preferably from 5 to 7 times. The stretching is preferably performed in such a manner that the total stretch ratio reaches 5 times or more. The stretching step may also be performed during the dyeing step or other steps. When stretching is also performed in any step other than the stretching step, the total stretch ratio refers to the total of the stretch ratios in all the steps involving stretching.

The dyeing step performed on the laminate (a') may include adsorbing a dichroic dye or iodine to the PVA-based resin layer and orienting the dye or iodine. The dyeing step may be performed together with the stretching step. The dyeing step is generally performed by, for example, immersing the laminate (a') in an iodine solution for any desired time. The iodine solution may be an aqueous iodine solution, such as an aqueous solution containing iodine and iodide ions derived from an iodide compound as a dissolution aid. The iodide compound may be, for example, potassium iodide, lithium iodide, sodium iodide, zinc iodide, aluminum iodide, lead iodide, copper iodide, barium iodide, calcium iodide, tin iodide, or titanium iodide. The iodide compound is preferably potassium iodide. The same applies to the iodide compound for use in any other step in the invention.

The concentration of iodine in the iodine solution may be from about 0.01 to about 10% by weight, preferably from 0.02 to 5% by weight, more preferably from 0.02 to 0.5% by weight. The concentration of the iodide compound used is preferably from about 0.1 to about 10% by weight, more preferably from 0.2 to 8% by weight. In the dyeing with iodine, the temperature of the iodine solution is generally from about 20 to about 50° C., preferably from 25 to 40° C. The immersion time is generally in the range of about 10 to about 300 seconds, preferably in the range of 20 to 240 seconds.

Besides the above steps, the laminate (a') may be subjected to, for example, an insolubilization step, a crosslinking step, a drying (water content control) step, and other steps.

The insolubilization step and the crosslinking step may be performed using a boron compound as a crosslinking agent. These steps may be performed in any order. The crosslinking step may be performed together with the dyeing step or the stretching step. The insolubilization step and the crosslinking step may be performed a plurality of times. The boron compound may be, for example, boric acid or borax. The boron compound is generally used in the form of an aqueous solution or a solution in a water-organic solvent mixture. An aqueous boric acid solution is generally used. The aqueous boric acid solution may have a boric acid concentration of about 1 to about 10% by weight, preferably 2 to 7% by weight. This boric acid concentration is preferred for imparting heat resistance depending on the degree of crosslinking or for suppressing damage during the peeling off of the carrier film. The aqueous boric acid solution or the like may contain an iodide compound such as potassium iodide. When containing an iodide compound, the aqueous boric acid solution used preferably has an iodide compound concentration of about 0.1 to about 10% by weight, more preferably 0.5 to 8% by weight.

<Step (4)>

As described above, the step (4) of forming the protective film 2 on the polarizer 1 side of the laminate (a) is preferably performed before the step (2). The step (4) produces the carrier film-attached one-side-protected polarizing film A' having the protective film 2 on only one side of the polarizer 1.

<<Protective Film>>

The protective film is preferably made of a material having a high level of transparency, mechanical strength, thermal stability, water barrier properties, isotropy, and other properties. Examples of such a material include polyester-based polymers such as polyethylene terephthalate and polyethylene naphthalate, cellulose-based polymers such as diacetyl cellulose and triacetyl cellulose, acryl-based polymers such as polymethyl methacrylate, styrene-based polymers such as polystyrene and acrylonitrile-styrene copolymers (AS resins), and polycarbonate-based polymers. Examples of polymers that may be used to form the transparent protective film also include polyolefin-based polymers such as polyethylene, polypropylene, cyclo-based or norbornene-structure-containing polyolefin, and ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers. Any of these protective films is generally bonded to the polarizer by means of an adhesive layer.

The protective film may also contain any type of one or more appropriate additives. Examples of such additives include ultraviolet absorbers, antioxidants, lubricants, plasticizers, release agents, discoloration preventing agents, flame retardants, nucleating agents, antistatic agents, pigments, and colorants. The content of the thermoplastic resin in the protective film is preferably from 50 to 100% by weight, more preferably from 50 to 99% by weight, even more preferably from 60 to 98% by weight, further more preferably from 70 to 97% by weight. If the content of the thermoplastic resin in the protective film is 50% by weight or less, high transparency and other properties inherent in the thermoplastic resin may fail to be sufficiently exhibited.

The protective film may also be, for example, a retardation film, a brightness enhancement film, or a diffusion film. The retardation film may have an in-plane retardation of 40 nm or more and/or a thickness direction retardation of 80 nm or more. The in-plane retardation is generally adjusted to fall within the range of 40 to 200 nm, and the thickness direction retardation is generally adjusted to fall within the range of 80 to 300 nm. When a retardation film is used as the protective film, the retardation film can also serve as a polarizer protecting film, which contributes to thickness reduction.

The retardation film may be a birefringent film formed by subjecting a thermoplastic resin film to uniaxial or biaxial stretching. The stretching temperature, the stretch ratio, and other conditions may be appropriately selected depending on the retardation value, the film material, and the thickness.

The thickness of the protective film may be selected as appropriate. Generally in view of strength, workability such as handleability, thin layer formability, and other properties, the thickness of the protective film is preferably from 3 to 200 µm, more preferably from 3 to 100 µm. In particular, the thickness of the protective film (in the case where the film is formed in advance) is preferably from 10 to 60 µm, more preferably from 10 to 45 µm, in view of feedability. On the other hand, the thickness of the protective film (in the case where it is formed by coating and curing) is preferably from 3 to 25 μm, more preferably from 3 to 20 μm, in view of feedability. A plurality of pieces or layers of the protective film may also be used.

The surface of the protective film, opposite to its surface where the polarizer is bonded, may be provided with a functional layer such as a hard coat layer, an anti-reflection layer, an anti-sticking layer, a diffusion layer, or an antiglare layer. The functional layer such as a hard coat layer, an anti-reflection layer, an anti-sticking layer, a diffusion layer, or an antiglare layer may be provided as part of the protective film itself or as a layer independent of the protective film.

<Intervening Layer>

The protective film and the polarizer are laminated with an intervening layer, such as an adhesive layer, a pressure-sensitive adhesive layer, or an undercoat layer (primer layer), between them. In this case, the intervening layer should preferably be used to laminate them with no air gap between them. Note that FIG. 1 does not show such an intervening layer between the polarizer 1 and the protective film 2.

The adhesive layer is made from an adhesive. Any of various types of adhesives may be used. The adhesive layer may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

The water-based adhesive may be, for example, an isocyanate-based adhesive, a polyvinyl alcohol-based adhesive, a gelatin-based adhesive, a vinyl-based adhesive, a latex-based adhesive, or a water-based polyester adhesive. The water-based adhesive is generally used in the form of an aqueous solution, which generally has a solids content of 0.5 to 60% by weight.

The active energy ray-curable adhesive is an adhesive capable of being cured by exposure to active energy rays such as electron beams or ultraviolet rays (a radically or cationically curable adhesive). The active energy ray-curable adhesive to be used may be of, for example, an electron beam-curable type or an ultraviolet-curable type. The active energy ray-curable adhesive may be, for example, a photo-radically curable adhesive. The photo-radically curable type active energy ray-curable adhesive may be of an ultraviolet-curable type. In this case, the adhesive should contain a radically polymerizable compound and a photopolymerization initiator.

The method for applying the adhesive is appropriately selected depending on the viscosity of the adhesive and the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

For example, when the water-based adhesive is used, the adhesive is preferably applied in such a manner that the finally formed adhesive layer can have a thickness of 30 to 300 nm. The adhesive layer more preferably has a thickness of 60 to 150 nm. On the other hand, when the active energy ray-curable adhesive is used, the adhesive layer is preferably formed with a thickness of 0.2 to 20 μm.

In the process of laminating the polarizer and the protective film, an adhesion-facilitating layer may be placed between the protective film and the adhesive layer. The adhesion-facilitating layer may be made of, for example, any of various resins having a polyester skeleton, a polyether skeleton, a polycarbonate skeleton, a polyurethane skeleton, a silicone skeleton, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

The adhesion-facilitating layer is usually provided in advance on the protective film, and then the adhesion-facilitating layer side of the protective film is bonded to the polarizer with the adhesive layer. The adhesion-facilitating layer can be formed using a known technique that includes applying an adhesion-facilitating-layer-forming material onto the protective film and drying the material. The adhesion-facilitating-layer-forming material is generally prepared in the form of a solution which is diluted to a suitable concentration taking into account the coating thickness after drying, the smoothness of the application, and other factors. After dried, the adhesion-facilitating layer preferably has a thickness of 0.01 to 5 μm, more preferably 0.02 to 2 μm, even more preferably 0.05 to 1 μm. Two or more adhesion-facilitating layers may be provided. Also in this case, the total thickness of the adhesion-facilitating layers preferably falls within these ranges.

The pressure-sensitive adhesive layer is made from a pressure-sensitive adhesive. Any of various pressure-sensitive adhesives may be used, examples of which include rubber-based pressure-sensitive adhesives, acryl-based pressure-sensitive adhesives, silicone-based pressure-sensitive adhesives, polyurethane-based pressure-sensitive adhesives, vinyl alkyl ether-based pressure-sensitive adhesives, polyvinylpyrrolidone-based pressure-sensitive adhesives, polyacrylamide-based pressure-sensitive adhesives, and cellulose-based pressure-sensitive adhesives. The base polymer with adhesive properties is selected depending on the type of the pressure-sensitive adhesive. Among these pressure-sensitive adhesive adhesives, acryl-based pressure-sensitive adhesives are preferably used because they have a high level of optical transparency, weather resistance, heat resistance, and other properties, and exhibit an appropriate level of wettability and adhesive properties including cohesiveness and adhesiveness.

The undercoat layer (primer layer) is formed to improve the adhesion between the polarizer and the protective film. The primer layer may be made of any material capable of providing somewhat strong adhesion to both the base film and a polyvinyl alcohol-based resin layer. For example, a thermoplastic resin having a high level of transparency, thermal stability, and stretchability may be used to form the primer layer. Such a thermoplastic resin may be, for example, an acryl-based resin, a polyolefin-based resin, a polyester-based resin, a polyvinyl alcohol-based resin, or any mixture thereof.

<Step (2)>

The step (2) includes peeling off the carrier film 3 from the laminate (a) or the carrier film-attached one-side-protected polarizing film A'. The carrier film 3 may be peeled off by any method. The carrier film 3 being peeled off may be angled toward the polarizer 1 side (or the one-side-protected polarizing film A side) or the carrier film 3 side. The carrier film 3 being peeled off may also be angled toward both sides. In any case, the thin polarizer 1 can be easily damaged by the peeling off of the carrier film 3. The angle at which the carrier film 3 is to be peeled off may be selected freely. There is a certain angle at which the peel strength for the peeling off of the carrier film 3 is the weakest. The angle at which weak peel strength can be achieved may be selected as appropriate because it depends on the configuration, the peel rate, the humidity during the peeling off, and the rigidity of the film to be peeled off.

<Step (3)>

The step (3) includes forming the transparent resin layer 4 on the polarizer 1 side, from which the carrier film 3 has been peeled off in the step (2), to produce the polarizing film. FIG. 1 shows an exemplary case where the transparent resin layer 4 is provided on one surface of the polarizer 1 of the one-side-protected polarizing film A (the surface opposite to the surface on which the protective film 2 is placed), which includes the polarizer 1 and the protective film 2 provided on only the other surface of the polarizer 1.

<<Transparent Resin Layer>>

In the invention, the transparent resin layer preferably has an 80° C. compressive elastic modulus of 0.1 GPa or more. When the 80° C. compressive elastic modulus of the transparent resin layer is controlled to 0.1 GPa or more, any defect caused by a damage occurring in the polarizer can be prevented from expanding even under heating conditions. The compressive elastic modulus of the transparent resin layer is preferably 0.5 GPa or more, more preferably 3 GPa or more, even more preferably 5 GPa or more, furthermore preferably 8 GPa or more. The compressive elastic modulus of the transparent resin layer can be controlled by selecting the material. The 80° C. compressive elastic modulus of the transparent resin layer is the value measured by the method described in the EXAMPLES section.

For suppression of the expansion of damaged portions, the transparent resin layer is formed to have a thickness of 0.2 µm or more. The thickness is preferably 0.5 µm or more, more preferably 0.7 µm or more. On the other hand, in view of optical reliability, the thickness of the transparent resin layer is preferably 5 µm or less, more preferably 3 µm or less, even more preferably less than 3 µm, further more preferably 2 µm or less.

Examples of materials that may be used to form the transparent resin layer include polyester-based resins, polyether-based resins, polycarbonate-based resins, polyurethane-based resins, silicone-based resins, polyamide-based resins, polyimide-based resins, PVA-based resins, acryl-based resins, and epoxy-based resins. These resin materials may be used singly or in combination of two or more. Among these materials, one or more selected from the group consisting of polyurethane-based resins, PVA-based resins, acryl-based resins, and epoxy-based resins are preferred, and PVA-based resins or acryl-based resins are more preferred.

The transparent resin layer can be formed by applying, to the surface of the polarizer (the surface from which the carrier film has been peeled off), a liquid material containing a resin component or a curable component capable of forming a resin and then solidifying or curing the liquid material. The liquid material may be in the form of a coating liquid, which may be of any type such as a water-based coating liquid, an aqueous dispersion-based coating liquid, a solvent-based coating liquid, or a solvent-free coating liquid as long as it is in a liquid state.

The liquid material (coating liquid) advantageously has relatively low viscosity so that it can easily penetrate into a damaged portion of the polarizer. The viscosity value is preferably 2,000 mPa·s or less, more preferably 1,000 mPa·s or less, even more preferably 500 mPa·s or less, further more preferably 100 mPa·s or less, as measured at 25° C.

To form the transparent resin layer, the applied liquid material containing the resin component should be solidified depending on the type of the resin component. The liquid material containing the resin component is a solution or dispersion in which the resin component is dissolved or dispersed in a solvent. The liquid material containing the resin component is used, for example, in the form of a water-based solution, an aqueous dispersion, or a solvent-based solution. The solidification refers to a process in which the solvent is removed from the liquid material so that a resin layer is formed. For example, when the resin component is a polyvinyl alcohol-based resin, the liquid material may be used in the form of an aqueous solution, which can be solidified by heating or other methods. When the resin component is a water-soluble acrylic, the liquid material can also be solidified similarly.

On the other hand, to form the transparent resin layer, the applied liquid material containing the curable component capable of forming a resin should be cured depending on the type of the curable component so that the curable component can form a resin. The liquid material containing the curable component capable of forming a resin may be used in the form of a solvent-free material if the curable component is in a liquid state. A solution obtained by dissolving the curable component in a solvent may also be used as the liquid material. The liquid material may be used in the form of a solution also when the curable component is in a liquid state. The solvent may be selected as appropriate depending on the curable component to be used. For example, an acryl-based monomer capable of forming an acryl-based resin or an epoxy-based monomer capable of forming an epoxy resin may be used as the curable component. In this case, the liquid material containing the curable component can be cured by, for example, active energy ray irradiation (ultraviolet irradiation).

The transparent resin layer is preferably formed by applying, to the polarizer, the liquid material containing the resin component dissolved or dispersed in water, and then solidifying the liquid material. The resin component dissolved or dispersed in water refers to a resin dissolved in water at room temperature (25° C.) or a water-soluble resin dissolved in an aqueous solvent at room temperature (25° C.). The coating liquid is advantageously a water-based liquid or an aqueous-based dispersion so that it can be well absorbed into damaged portions by allowing the surface of the polarizer to swell. Specifically, when the coating liquid is a water-based liquid or an aqueous-based dispersion, it can partially relax the orientation of polyvinyl alcohol molecules at and near the damaged portions in the polarizer and can also reduce the boric acid content at and near the damaged portions. Therefore, even though thin (e.g., less than 3 µm, preferably 2 µm or less in thickness), the transparent resin layer can effectively suppress expansion of the damaged portions.

Typical examples of the resin component soluble or dispersible in water include polyvinyl alcohol-based resins, poly(meth)acrylic acid, polyacrylamide, methylolated melamine resins, methylolated urea resins, resol-type phenolic resins, polyethylene oxide, and carboxymethyl cellulose. These resins may be used alone or in combination of two or more. A polyvinyl alcohol-based resin, poly(meth) acrylic acid, or a methylolated melamine resin is preferably used as the resin component. A polyvinyl alcohol-based resin is particularly preferred as the resin component in terms of adhesion between the resin component and the polyvinyl alcohol-based resin in the polarizer. Hereinafter, a case where a polyvinyl alcohol-based resin is used will be described.

The transparent resin layer is preferably made from a layer-forming material including a polyvinyl alcohol-based resin. The polyvinyl alcohol-based resin used to form the transparent resin layer may be the same as or different from the polyvinyl alcohol-based resin in the polarizer as long as it falls under the category of "polyvinyl alcohol-based resin."

The transparent resin layer made from the layer-forming material including a polyvinyl alcohol-based resin preferably has a thickness of 0.2 μm or more in order to repair any damage occurring at the surface of the polarizer and thus to maintain the optical properties. The transparent resin layer preferably has a thickness of 0.5 μm or more, more preferably 0.7 μm or more. On the other hand, if too thick, the transparent resin layer can reduce optical reliability and water resistance. Therefore, the transparent resin layer preferably has a thickness of 3 μm or less, more preferably less than 3 μm, even more preferably 2 μm or less.

The polyvinyl alcohol-based resin may be, for example, polyvinyl alcohol. Polyvinyl alcohol can be obtained by saponifying polyvinyl acetate. The polyvinyl alcohol-based resin may also be a product produced by saponifying a copolymer of vinyl acetate and any other monomer or monomers copolymerizable therewith. In this case, when the copolymerizable monomer is ethylene, an ethylene-vinyl alcohol copolymer can be obtained. Examples of the copolymerizable monomer include unsaturated carboxylic acids such as maleic acid (anhydride), fumaric acid, crotonic acid, itaconic acid, and (meth)acrylic acid, and esters thereof; α-olefins such as ethylene and propylene; (sodium) (meth) allylsulfonate, sodium sulfonate (monoalkyl maleate), sodium disulfonate alkyl maleate, N-methylolacrylamide, acrylamide alkyl sulfonate alkali salts, N-vinylpyrrolidone, and N-vinylpyrrolidone derivatives. These polyvinyl alcohol-based resins may be used alone or in combination of two or more.

The polyvinyl alcohol-based resin to be used may have a saponification degree of, for example, 95% by mole or more. In view of the transparent layer can have a satisfactory level of moist heat resistance or water resistance, the polyvinyl alcohol-based resin preferably has a saponification degree of 99% by mole or more, more preferably 99.7% by mole or more. The saponification degree indicates the proportion of the units actually saponified to vinyl alcohol units in the units capable of being converted to vinyl alcohol units by saponification, after which vinyl ester units can remain as residues. The saponification degree can be determined according to JIS K 6726-1994.

The polyvinyl alcohol-based resin to be used may have an average degree of polymerization of, for example, 500 or more. In view of the transparent layer can have a satisfactory level of moist heat resistance or water resistance, the polyvinyl alcohol-based resin preferably has an average degree of polymerization of 1,000 or more, more preferably 1,500 or more, even more preferably 2,000 or more. The average degree of polymerization of the polyvinyl alcohol-based resin can be measured according to JIS K 6726.

The polyvinyl alcohol-based resin to be used may also be a modified polyvinyl alcohol-based resin having a hydrophilic functional group on the side chain of the polyvinyl alcohol or copolymerized polyvinyl alcohol. The hydrophilic functional group may be, for example, an acetoacetyl group or a carbonyl group. Other examples of the polyvinyl alcohol resin that may be used include modified polyvinyl alcohols obtained by, for example, acetalization, urethanation, etherification, or phosphorylation of polyvinyl alcohol resin or grafting on polyvinyl alcohol resin.

The content of the polyvinyl alcohol-based resin in the transparent resin layer or the layer-forming material (solid basis) is preferably 80% by weight or more, more preferably 90% by weight or more, even more preferably 95% by weight or more.

The layer-forming material may be prepared as a solution by dissolving the polyvinyl alcohol-based resin in a solvent. Examples of the solvent include water, dimethyl sulfoxide, dimethylformamide, dimethylacetamide, N-methylpyrrolidone, various glycols, polyhydric alcohols including trimethylolpropane, and amines such as ethylenediamine and diethylenetriamine. These solvents may be used alone or in combination of two or more. Among them, water is preferably used as the solvent to form the layer-forming material as an aqueous solution. The concentration of the polyvinyl alcohol-based resin in the layer-forming material (e.g., an aqueous solution) may be, but not limited to, 0.1 to 15% by weight, preferably 0.5 to 10% by weight, in view of coatability, shelf stability, and other properties.

An additive may also be added as appropriate to the layer-forming material (e.g., aqueous solution). Examples of the additive include a plasticizer, a surfactant or the like. The plasticizer may be, for example, a polyhydric alcohol such as ethylene glycol or glycerin. The surfactant may be, for example, a nonionic surfactant. The layer-forming material may also contain a coupling agent such as a silane coupling agent or a titanium coupling agent, any of various tackifiers, an ultraviolet absorber, an antioxidant, and a stabilizer such as a heat-resistant stabilizer or a hydrolysis-resistant stabilizer.

The transparent resin layer may be formed by applying the layer-forming material to the other surface of the polarizer (the surface opposite to its surface on which the protective film is provided) and drying the material. The layer-forming material is applied in such a manner that a 0.2-μm-thick coating can be formed after drying. The application process is not limited, and any appropriate method may be used in the application process. For example, roll coating, spin coating, wire bar coating, dip coating, die coating, curtain coating, spray coating, knife coating, (such as comma coating), or various other methods may be used. In general, the drying temperature is preferably from 60 to 200° C., more preferably from 70 to 120° C. The drying time is preferably from 10 to 1800 seconds, more preferably from 20 to 600 seconds.

Next, a description will be given of a case where the liquid material containing the curable component capable of forming a resin is used to form the transparent resin layer. The curable component can be broadly classified into an active energy ray-curable type such as an electron beam-curable type, an ultraviolet-curable type, or a visible light-curable type; and a thermosetting type. The ultraviolet-curable type and the visible light-curable type can be further classified into a radically polymerizable curable type and a cationically polymerizable curable type. In the invention, active energy rays in the wavelength range of 10 nm to less than 380 nm are called ultraviolet rays or ultraviolet light, and active energy rays in the wavelength range of 380 nm to 800 nm are called visible rays or visible light. The curable component of the radically polymerizable curable material can be used as a thermosetting curable component.

<<Radically Polymerizable, Curable, Layer-Forming Material>>

Examples of the curable component include radically polymerizable compounds. Radically polymerizable compounds include compounds having a radically-polymerizable carbon-carbon double bond-containing functional group, such as a (meth)acryloyl group or a vinyl group. The curable component may be any of a monofunctional radically polymerizable compound or a bifunctional or polyfunctional radically polymerizable compound. These radically polymerizable compounds may be used singly or in combination of two or more. These radically polymerizable compounds are preferably, for example, (meth)acryloyl group-containing compounds. In the invention, the term "(meth)acryloyl" means acryloyl and/or methacryloyl, and hereinafter, "(meth)" is used in the same meaning.

<<Monofunctional Radically Polymerizable Compound>>

The monofunctional radically polymerizable compound may be, for example, a (meth)acrylamide derivative having a (meth)acrylamide group. The (meth)acrylamide derivative is preferable in order to ensure the adhesion to the polarizer and in terms of having high polymerization rate and providing high productivity. Examples of the (meth)acrylamide derivative include N-alkyl group-containing (meth)acrylamide derivatives such as N-methyl(meth)acrylamide, N,N-dimethyl(meth)acrylamide, N,N-diethyl(meth)acrylamide, N-isopropyl(meth)acrylamide, N-butyl(meth)acrylamide, and N-hexyl(meth)acrylamide; N-hydroxyalkyl group-containing (meth)acrylamide derivatives such as N-methylol (meth)acrylamide, N-hydroxyethyl(meth)acrylamide, and N-methylol-N-propane(meth)acrylamide; N-aminoalkyl group-containing (meth)acrylamide derivatives such as aminomethyl(meth)acrylamide and aminoethyl(meth)acrylamide; N-alkoxy group-containing (meth)acrylamide derivatives such as N-methoxymethylacrylamide and N-ethoxymethylacrylamide; and N-mercaptoalkyl group-containing (meth)acrylamide derivatives such as mercaptomethyl(meth)acrylamide and mercaptoethyl(meth)acrylamide. Heterocyclic ring-containing (meth)acrylamide derivatives in which the nitrogen atom of a (meth)acrylamide group forms a heterocyclic ring may also be used, such as N-acryloylmorpholine, N-acryloylpiperidine, N-methacryloylpiperidine, and N-acryloylpyrrolidine.

Among the (meth)acrylamide derivatives, N-hydroxyalkyl group-containing (meth)acrylamide derivatives are preferred in view of adhesion to the polarizer, and N-hydroxyethyl(meth)acrylamide is particularly preferred.

Examples of the monofunctional radically polymerizable compound also include various (meth)acrylic acid derivatives having a (meth)acryloyloxy group. Specific examples include (C1 to C20) alkyl (meth)acrylates such as methyl (meth)acrylate, ethyl (meth)acrylate, n-propyl (meth)acrylate, isopropyl (meth)acrylate, 2-methyl-2-nitropropyl (meth)acrylate, n-butyl (meth)acrylate, isobutyl (meth)acrylate, sec-butyl (meth)acrylate, tert-butyl (meth)acrylate, n-pentyl (meth)acrylate, tert-pentyl (meth)acrylate, 3-pentyl (meth)acrylate, 2,2-dimethylbutyl (meth)acrylate, n-hexyl (meth)acrylate, cetyl (meth)acrylate, n-octyl (meth)acrylate, 2-ethylhexyl (meth)acrylate, 4-methyl-2-propylpentyl (meth)acrylate, and n-octadecyl (meth)acrylate.

Examples of the (meth)acrylic acid derivatives also include cycloalkyl (meth)acrylates such as cyclohexyl (meth)acrylate and cyclopentyl (meth)acrylate; aralkyl (meth)acrylates such as benzyl (meth)acrylate; polycyclic (meth)acrylates such as 2-isobornyl (meth)acrylate, 2-norbornylmethyl (meth)acrylate, 5-norbornen-2-yl-methyl (meth)acrylate, 3-methyl-2-norbornylmethyl (meth)acrylate, dicyclopentenyl (meth)acrylate, dicyclopentenyloxyethyl (meth)acrylate and dicyclopentanyl (meth)acrylate; and alkoxy group- or phenoxy group-containing (meth) acrylates such as 2-methoxyethyl (meth)acrylate, 2-ethoxyethyl (meth)acrylate, 2-methoxymethoxyethyl (meth)acrylate, 3-methoxybutyl (meth)acrylate, ethylcarbitol (meth) acrylate, phenoxyethyl (meth)acrylate, and alkylphenoxy polyethylene glycol (meth)acrylate.

Examples of the (meth)acrylic acid derivatives also include hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth) acrylate, 8-hydroxyoctyl (meth)acrylate, 10-hydroxydecyl (meth)acrylate, and 12-hydroxylauryl (meth)acrylate, and other hydroxy group-containing (meth)acrylates such as [4-(hydroxymethyl)cyclohexyl]methyl acrylate, cyclohexanedimethanol mono(meth)acrylate, and 2-hydroxy-3-phenoxypropyl (meth)acylate; epoxy group-containing (meth)acrylates such as glycidyl (meth)acrylate and 4-hydroxybutyl (meth)acrylate glycidyl ether; halogen-containing (meth)acrylates such as 2,2,2-trifluoroethyl (meth)acrylate, 2,2,2-trifluoroethylethyl (meth)acrylate, tetrafluoropropyl (meth)acrylate, hexafluoropropyl (meth) acrylate, octafluoropentyl (meth)acrylate, heptadecafluorodecyl (meth)acrylate, and 3-chloro-2-hydroxypropyl (meth) acrylate; alkylaminoalkyl (meth)acrylates such as dimethylaminoethyl (meth)acrylate; oxetane group-containing (meth)acrylates such as 3-oxetanylmethyl (meth)acrylate, 3-methyl-oxetanylmethyl (meth)acrylate, 3-ethyl-oxetanylmethyl (meth)acrylate, 3-butyl-oxetanylmethyl (meth)acrylate, and 3-hexyl-oxetanylmethyl (meth)acrylate; heterocyclic ring-containing (meth)acrylates such as tetrahydrofurfuryl (meth)acrylate and butyrolactone (meth)acrylate; and (meth)acrylic acid adducts of neopentyl glycol hydroxypivalate, and p-phenylphenol (meth)acrylate.

Examples of the monofunctional radically polymerizable compound also include carboxyl group-containing monomers such as (meth)acrylic acid, carboxyethyl acrylate, carboxypentyl acrylate, itaconic acid, maleic acid, fumaric acid, crotonic acid, and isocrotonic acid.

Examples of the monofunctional radically polymerizable compound also include vinyl lactam monomers such as N-vinylpyrrolidone, N-vinyl-ε-caprolactam, and methylvinylpyrrolidone; and vinyl monomers having a nitrogen-containing heterocyclic ring, such as vinylpyridine, vinylpiperidone, vinylpyrimidine, vinylpiperazine, vinylpyrazine, vinylpyrrole, vinylimidazole, vinyloxazole, and vinylmorpholine.

The monofunctional radically polymerizable compound may also be a radically polymerizable compound having an active methylene group. The radically polymerizable compound having an active methylene group should be a compound having an active double-bond group such as a (meth) acrylic group at its end or in its molecule and also having an active methylene group. The active methylene group may be, for example, an acetoacetyl group, an alkoxymalonyl group, or a cyanoacetyl group. The active methylene group is preferably an acetoacetyl group. Examples of the radically polymerizable compound having an active methylene group include acetoacetoxyalkyl (meth)acrylates such as 2-acetoacetoxyethyl (meth)acrylate, 2-acetoacetoxypropyl (meth)acrylate, and 2-acetoacetoxy-1-methylethyl (meth) acrylate; 2-ethoxymalonyloxyethyl (meth)acrylate, 2-cyanoacetoxyethyl (meth)acrylate, N-(2-cyanoacetoxyethyl) acrylamide, N-(2-propionylacetoxybutyl)acrylamide, N-(4-acetoacetoxymethylbenzyl)acrylamide, and N-(2-acetoacetylaminoethyl)acrylamide. The radically polymerizable compound having an active methylene group is preferably acetoacetoxyalkyl (meth)acrylate.

<<Polyfunctional Radically Polymerizable Compound>>

Examples of the bifunctional or polyfunctional radically polymerizable compound include tripropylene glycol di(meth)acrylate, tetraethylene glycol di(meth)acrylate, 1,6-hexanediol di(meth)acrylate, 1,9-nonanediol di(meth)acrylate, 1,10-decanediol diacrylate, 2-ethyl-2-butylpropanediol di(meth)acrylate, bisphenol A di(meth)acrylate, bisphenol A ethylene oxide adduct di(meth)acrylate, bisphenol A propylene oxide adduct di(meth)acrylate, bisphenol A diglycidyl ether di(meth)acrylate, neopentyl glycol di(meth)acrylate, tricyclodecanedimethanol di(meth)acrylate, cyclic trimethylolpropane formal (meth)acrylate, dioxaneglycol di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, polyhydric alcohol esters of (meth)acrylic acid, such as EO-modified diglycerin tetra(meth)acrylate, and 9,9-bis[4-(2-(meth)acryloyloxyethoxy)phenyl]fluorene. Specific examples include Aronix M-220 and Aronix M-306 (manufactured by Toagosei Co., Ltd.), LIGHT ACRYLATE 1,9ND-A (manufactured by Kyoeisha Chemical Co., Ltd.), LIGHT ACRYLATE DGE-4A (manufactured by Kyoeisha Chemical Co., Ltd.), LIGHT ACRYLATE DCP-A (manufactured by Kyoeisha Chemical Co., Ltd.), SR-531 (manufactured by Sartomer), and CD-536 (manufactured by Sartomer). If necessary, various epoxy (meth)acrylates, urethane (meth)acrylates, polyester (meth)acrylates, or various (meth)acrylate-based monomers may also be used.

In order to achieve both good adhesion to the polarizer and good optical durability, the monofunctional radically polymerizable compound is preferably used in combination with the polyfunctional radically polymerizable compound. In general, 3 to 80% by weight of the monofunctional radically polymerizable compound is preferably used in combination with 20 to 97% by weight of the polyfunctional radially polymerizable compound based on 100% by weight of the radically polymerizable compounds.

<<Mode of Radically Polymerizable, Curable, Layer-Forming Material>>

The radically polymerizable, curable, layer-forming material to be used may be an active energy ray-curable, layer-forming material or a thermosetting, layer-forming material. When an electron beam is used as the active energy ray, the active energy ray-curable, layer-forming material does not have to contain a photopolymerization initiator, but when an ultraviolet or visible ray is used as the active energy ray, the active energy ray-curable, layer-forming material should preferably contain a photopolymerization initiator. On the other hand, when the curable component is used as a thermosetting component, the layer-forming material should preferably contain a thermal polymerization initiator.

<<Photopolymerization Initiator>>

The photopolymerization initiator for use with the radically polymerizable compound is appropriately selected depending on the type of the active energy ray. For curing with ultraviolet or visible light, an ultraviolet or visible light-cleavable photopolymerization initiator should be used. Examples of the photopolymerization initiator include benzophenone-based compounds such as benzil, benzophenone, benzoylbenzoic acid, and 3,3'-dimethyl-4-methoxybenzophenone; aromatic ketone compounds such as 4-(2-hydroxyethoxy)phenyl(2-hydroxy-2-propyl)ketone, α-hydroxy-α,α'-dimethylacetophenone, 2-methyl-2-hydroxypropiophenone, and α-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds such as benzoin methyl ether, benzoin ethyl ether, benzoin isopropyl ether, benzoin butyl ether, and anisoin methyl ether; aromatic ketal-based compounds such as benzyl dimethyl ketal; aromatic sulfonyl chloride-based compounds such as 2-naphthalenesulfonyl chloride; optically active oxime-based compounds such as 1-phenone-1, 1-propanedione-2-(o-ethoxycarbonyl)oxime; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, and dodecylthioxanthone; camphorquinone; halogenated ketones; acylphosphine oxide; and acylphosphonate.

The content of the photopolymerization initiator should be 20 parts by weight or less based on 100 parts by weight of the total amount of the curable components (radically polymerizable compounds). The content of the photopolymerization initiator is preferably from 0.01 to 20 parts by weight, more preferably from 0.05 to 10 parts by weight, even more preferably from 0.1 to 5 parts by weight.

When the curable, layer-forming material used is a visible light-curable, layer-forming material containing the radically polymerizable compound as the curable component, a photopolymerization initiator having high sensitivity particularly to light of 380 nm or longer is preferably used in the layer-forming material. The photopolymerization initiator having high sensitivity to light of 380 nm or longer will be described later.

A compound represented by formula (1):

[Formula. 1]

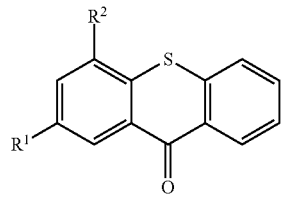

wherein $R^1$ and $R^2$ each represent —H, —CH$_2$CH$_3$, -i-Pr, or Cl, and $R^1$ and $R^2$ may be the same or different, is preferably used alone as the photopolymerization initiator or preferably used as the photopolymerization initiator in combination with another photopolymerization initiator having high sensitivity to light of 380 nm or longer described later. The resulting adhesion is higher when the compound of formula (1) is used than when a photopolymerization initiator having high sensitivity to light of 380 nm or longer is used alone. In particular, the compound of formula (1) is preferably diethyl thioxanthone in which $R^1$ and $R^2$ are each —CH$_2$CH$_3$. The content of the compound of formula (1) in the layer-forming material is preferably from 0.1 to 5 parts by weight, more preferably from 0.5 to 4 parts by weight, even more preferably from 0.9 to 3 parts by weight, based on 100 parts by weight of the total amount of the curable components.

If necessary, a polymerization initiation aid is preferably added to the layer-forming material. In particular, the polymerization initiation aid is preferably triethylamine, diethylamine, N-methyldiethanolamine, ethanolamine, 4-dimethylaminobenzoic acid, methyl 4-dimethylaminobenzoate, ethyl 4-dimethylaminobenzoate, or isoamyl 4-dimethylaminobenzoate. Ethyl 4-dimethylaminobenzoate is particularly preferred. When the polymerization initiation aid is used, the content of the aid is generally 0 to 5 parts by weight, preferably 0 to 4 parts by weight, most preferably 0 to 3 parts by weight, based on 100 parts by weight of the total amount of the curable components.

If necessary, a known photopolymerization initiator may be used in combination. Since the protective film having the ability to absorb UV does not transmit light of 380 nm or shorter, such a photopolymerization initiator should preferably have high sensitivity to light of 380 nm or longer. Examples of such an initiator include 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, 2,4,6-trimethylbenzoyl-diphenylphosphine oxide, bis(2,4,6-trimethylbenzoyl)-phenylphosphine oxide, and bis(η5-2,4-cyclopentadien-1-yl)-bis(2,6-difluoro-3-(1H-pyrrol-1-yl)-phenyl)titanium.

In particular, a compound represented by formula (2):

[Formula. 2]

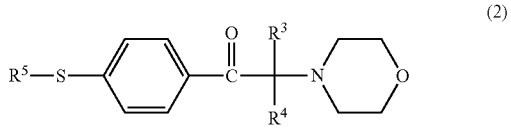

(2)

wherein $R^3$, $R^4$, and $R^5$ each represent —H, —$CH_3$, —$CH_2CH_3$, -i-Pr, or Cl, and $R^3$, $R^4$, and $R^5$ may be the same or different, is preferably used in addition to the photopolymerization initiator of formula (1). Commercially available 2-methyl-1-(4-methylthiophenyl)-2-morpholinopropan-1-one (IRGACURE 907 (trade name) manufactured by BASF) is preferably used as the compound of formula (2). Besides this, 2-benzyl-2-dimethylamino-1-(4-morpholinophenyl)-butanone-1 (IRGACURE 369 (trade name) manufactured by BASF) and 2-(dimethylamino)-2-[(4-methylphenyl)methyl]-1-[4-(4-morpholinyl)phenyl]-1-butanone (IRGACURE 379 (trade name) manufactured by BASF) are preferred because of their high sensitivity.

<<Thermal Polymerization Initiator>>

The thermal polymerization initiator is preferably such that it does not start undergoing thermal cleavage-induced polymerization. For example, the thermal polymerization initiator preferably has a 10-hour half-life temperature of 65° C. or more, more preferably 75 to 90° C. The term "half-life," which is an indicator of how fast the polymerization initiator can be decomposed, refers to the time required for the remaining amount of the polymerization initiator to reach one half of the original amount. The decomposition temperature required for a certain half-life time and the half-life time obtained at a certain temperature are shown in catalogs furnished by manufacturers, such as Organic Peroxide Catalog, 9th Edition, May, 2003, furnished by NOF CORPORATION.

Examples of the thermal polymerization initiator include organic peroxides such as lauroyl peroxide (10-hour half-life temperature: 64° C.), benzoyl peroxide (10-hour half-life temperature: 73° C.) 1,1-bis(tert-butylperoxy)-3,3,5-trimethylcyclohexane (10-hour half-life temperature: 90° C.), di(2-ethylhexyl) peroxydicarbonate (10-hour half-life temperature: 49° C.), di(4-tert-butylcyclohexyl) peroxydicarbonate, di-sec-butyl peroxydicarbonate (10-hour half-life temperature: 51° C.) tert-butyl peroxyneodecanoate (10-hour half-life temperature: 48° C.), tert-hexyl peroxypivalate, tert-butyl peroxypivalate, dilauroyl peroxide (10-hour half-life temperature: 64° C.), di-n-octanoyl peroxide, 1,1, 3,3-tetramethylbutylperoxy-2-ethyl hexanoate (10-hour half-life temperature: 66° C.), di(4-methylbenzoyl) peroxide, dibenzoyl peroxide (10-hour half-life temperature: 73° C.), tert-butyl peroxyisobutyrate (10-hour half-life temperature: 81° C.), and 1,1-di(tert-hexylperoxy)cyclohexane.

Examples of the thermal polymerization initiator also include azo compounds such as 2,2'-azobisisobutyronitrile (10-hour half-life temperature: 67° C.) 2,2'-azobis(2-methylbutyronitrile) (10-hour half-life temperature: 67° C.), and 1,1-azobis-cyclohexane-1-carbonitrile (10-hour half-life temperature: 87° C.)

The content of the thermal polymerization initiator may be from 0.01 to 20 parts by weight based on 100 parts by weight of the total amount of the curable components (radically polymerizable compounds). The content of the thermal polymerization initiator is preferably from 0.05 to 10 parts by weight, more preferably from 0.1 to 3 parts by weight.

<<Cationically Polymerizable, Curable, Layer-Forming Material>>

The curable component of the cationically polymerizable, curable, layer-forming material may be an epoxy or oxetanyl group-containing compound. The epoxy group-containing compound may be any compound having at least two epoxy groups per molecule. A variety of generally known curable epoxy compounds may be used. Preferred epoxy compounds are, for example, compounds having at least two epoxy groups and at least one aromatic ring per molecule (aromatic-based epoxy compounds) or compounds having at least two epoxy groups per molecule, in which at least one of them is formed between two adjacent carbon atoms that form an alicyclic ring (alicyclic-based epoxy compounds).

<<Photo-Cationic Polymerization Initiator>>

The cationically polymerizable, curable, layer-forming material should contain, as curable components, the epoxy compound and the oxetane compound described above, which are both curable by cationic polymerization. Therefore, the cationically polymerizable, curable, layer-forming material should contain a photo-cationic polymerization initiator. When irradiated with active energy rays such as visible light, ultraviolet light, X-rays, or electron beams, the photo-cationic polymerization initiator can produce a cationic species or a Lewis acid to initiate the polymerization reaction of the epoxy or oxetanyl group.

A process of forming the transparent resin layer from the curable, layer-forming material may include applying the curable, layer-forming material to the surface of the polarizer and then curing the applied material.

The polarizer may be subjected to a surface modification treatment before the curable, layer-forming material is applied thereto. Specifically, such a treatment may be, for example, a corona treatment, a plasma treatment, or a saponification treatment.

The method for applying the curable, layer-forming material is appropriately selected depending on the viscosity of the curable, layer-forming material or the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

<Curing of Layer-Forming Material>

The curable, layer-forming material may be used as an active energy ray-curable, layer-forming material or a thermosetting, layer-forming material. The active energy ray-curable, layer-forming material may be of an electron beam-curable type, an ultraviolet-curable type, or a visible light-curable type. In view of productivity, an active energy ray-curable, layer-forming material is more preferred as the curable, layer-forming material than a thermosetting, layer-curable material. Also in view of productivity, a visible light-curable, layer-forming material is more preferred as the active energy ray-curable, layer-forming material.

<<Active Energy Ray-Curable Type>>

When the active energy ray-curable, layer-forming material is used, the active energy ray-curable, layer-forming material may be applied to the polarizer and then irradiated with active energy rays (such as electron beams, ultraviolet rays, or visible rays) so that the active energy ray-curable, layer-forming material can be cured to form the transparent resin layer. Active energy rays (such as electron beams, ultraviolet rays, or visible rays) may be applied in any suitable direction. Preferably, active energy rays are applied from the transparent resin layer side.

<<Electron Beam-Curable Type>>

When the active energy ray-curable, layer-forming material is of an electron beam-curable type, electron beams may be applied under any appropriate conditions where the active energy ray-curable, layer-forming material can be cured. For example, electron beams are preferably applied at an acceleration voltage of 5 kV to 300 kV, more preferably 10 kV to 250 kV. If the acceleration voltage is lower than 5 kV, electron beams may fail to reach the deepest portion of the transparent resin layer, so that insufficient curing may occur. If the acceleration voltage is higher than 300 kV, electron beams can have too high intensity penetrating through the material and thus may damage the protective film or the polarizer. The exposure dose is preferably from 5 to 100 kGy, more preferably from 10 to 75 kGy. At an exposure dose of less than 5 kGy, the adhesive may be insufficiently cured. An exposure dose of more than 100 kGy may damage the protective film or the polarizer and cause yellow discoloration or a reduction in mechanical strength, which may make it impossible to obtain the desired optical properties.

Electron beam irradiation is generally performed in an inert gas. If necessary, however, electron beam irradiation may be performed in the air or under conditions where a small amount of oxygen is introduced.

<<Ultraviolet-Curable Type and Visible Light-Curable Type>>

In a method for producing the polarizing film according to the invention, the active energy rays used preferably include visible rays in the wavelength range of 380 nm to 450 nm, specifically, visible rays whose dose is the highest in the wavelength range of 380 nm to 450 nm. In the invention, the active energy ray source is preferably a gallium-containing metal halide lamp or an LED light source capable of emitting light in the wavelength range of 380 to 440 nm. Alternatively, a low-pressure mercury lamp, a middle-pressure mercury lamp, a high-pressure mercury lamp, an ultra-high-pressure mercury lamp, an incandescent lamp, a xenon lamp, a halogen lamp, a carbon arc lamp, a metal halide lamp, a fluorescent lamp, a tungsten lamp, a gallium lamp, an excimer laser, or a source of light including ultraviolet and visible rays, such as sunlight, may be used, and light sources may be used in combination with a band pass filter to block ultraviolet rays with wavelengths shorter than 380 nm.

<<Thermosetting Type>>

On the other hand, when the thermosetting, layer-forming material is used, it may be heated so that the thermal polymerization initiator can initiate the polymerization to forma cured product layer. The heating temperature may be from about 60 to about 200° C., preferably from 80 to 150° C., though it is selected depending on the thermal polymerization initiator.

<Step (5)>

A pressure-sensitive-adhesive-layer-attached polarizing film (or one-side-protected polarizing film C) may be produced by placing a pressure-sensitive adhesive layer on the transparent resin layer 4 of the polarizing film (or one-side-protected polarizing film B) obtained as described above by the production method of the invention. A separator may be provided on the pressure-sensitive adhesive layer of the pressure-sensitive-adhesive-layer-attached polarizing film (or one-side-protected polarizing film C).

<Pressure-Sensitive Adhesive Layer>

The pressure-sensitive adhesive layer may be formed using any appropriate type of pressure-sensitive adhesive. Examples of the pressure-sensitive adhesive include a rubber-based pressure-sensitive adhesive, an acryl-based pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among these pressure-sensitive adhesives, those having a high level of optical transparency and weather resistance or heat resistance and exhibiting an appropriate level of wettability and adhesive properties such as cohesiveness and adhesiveness are preferably used. An acryl-based pressure-sensitive adhesive is preferably used because it has such properties.

The pressure-sensitive adhesive layer can be formed by a method including applying the pressure-sensitive adhesive to a release-treated separator or other means, removing the polymerization solvent and other components from the adhesive by drying to forma pressure-sensitive adhesive layer, and then transferring the pressure-sensitive adhesive layer onto the polarizer. Alternatively, the pressure-sensitive adhesive layer can be formed by a method including applying the pressure-sensitive adhesive to the polarizer and removing the polymerization solvent and other components from the adhesive by drying to form a pressure-sensitive adhesive layer on the polarizer. In the process of applying the pressure-sensitive adhesive, if necessary, one or more solvents other than the polymerization solvent may be newly added to the adhesive.

A silicone release liner is preferably used as the release-treated separator. In the invention, the pressure-sensitive adhesive may be applied to such a liner and then dried to forma pressure-sensitive adhesive layer. In this process, any appropriate method may be used for drying the pressure-sensitive adhesive, depending on purpose. Preferably, a method of heating and drying the coating film is used. The heating and drying temperature is preferably from 40° C. to 200° C., more preferably from 50° C. to 180° C., even more preferably from 70° C. to 170° C. When the heating temperature is set in the range, a pressure-sensitive adhesive with a high level of adhesive properties can be obtained.

Any appropriate drying time may be used as needed. The drying time is preferably from 5 seconds to 20 minutes, more preferably from 5 seconds to 10 minutes, even more preferably from 10 seconds to 5 minutes.

Various methods may be used to form the pressure-sensitive adhesive layer. Examples of such methods include roll coating, kiss roll coating, gravure coating, reverse coating, roll brush coating, spray coating, dip roll coating, bar coating, knife coating, air knife coating, curtain coating, lip coating, and extrusion coating with a die coater or other means.

The thickness of the pressure-sensitive adhesive layer is typically, but not limited to, about 1 to about 100 µm, preferably 2 to 50 µm, more preferably 2 to 40 µm, even more preferably 5 to 35 µm.

When the pressure-sensitive adhesive layer is exposed, the pressure-sensitive adhesive layer may be protected by a release-treated sheet (separator) until it is actually used.

Examples of the material used to form such a separator include a plastic film such as a polyethylene, polypropylene, polyethylene terephthalate, or polyester film, a paper, a cloth, a porous material such as nonwoven fabric, and appropriate thin materials such as a net, a foamed sheet, a metal foil, and any laminate thereof. A plastic film is preferably used because of its good surface smoothness.

Such a plastic film may be of any type capable of protecting the pressure-sensitive adhesive layer. Such a plastic film may be, for example, a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, or an ethylene-vinyl acetate copolymer film.

The separator generally has a thickness of about 5 to about 200 µm, preferably about 5 to about 100 µm. If necessary, the separator may be subjected to a release treatment and an anti-pollution treatment with a silicone-based, fluoride-based, long-chain alkyl-based, or fatty acid amide-based release agent, a silica powder, or other materials, or subjected to an antistatic treatment of coating type, kneading and mixing type, vapor-deposition type, or other types. In particular, when the surface of the separator is appropriately subjected to a release treatment such as a silicone treatment, a long-chain alkyl treatment, or a fluorine treatment, the releasability from the pressure-sensitive adhesive layer can be further improved.

<Surface Protective Film>

A surface protective film may be provided on the polarizing film (including the one-side-protected polarizing film and the pressure-sensitive-adhesive-layer-attached polarizing film) of the invention. The surface protective film generally has a base film and a pressure-sensitive adhesive layer. The surface protective film protects the polarizer with the pressure-sensitive adhesive layer interposed between them.

In view of the ability to be tested or managed, an isotropic or nearly-isotropic film material should be selected as the base film for the surface protective film. Examples of such a film material include polyester-based resins such as polyethylene terephthalate films, cellulose-based resins, acetate-based resins, polyethersulfone-based resins, polycarbonate-based resins, polyamide-based resins, polyimide-based resins, polyolefin-based resins, acryl-based resins, and other transparent polymers. In particular, polyester-based resins are preferred. The base film may be made of a single film material or a laminate of two or more film materials. The base film may also be a product obtained by stretching the film. The base film generally has a thickness of 500 µm or less, preferably 10 to 200 µm.

The pressure-sensitive adhesive used to form the pressure-sensitive adhesive layer for the surface protective film may be appropriately selected from pressure-sensitive adhesives including, as a base polymer, a (meth)acryl-based polymer, a silicone-based polymer, polyester, polyurethane, polyamide, polyether, fluoride-based polymer, rubber-based polymer, or any other polymer. An acrylic pressure-sensitive adhesive containing an acryl-based polymer as a base polymer is preferred in view of transparency, weather resistance, heat resistance, and other properties. The thickness (dry thickness) of the pressure-sensitive adhesive layer is selected depending on the desired adhesive strength. The thickness of the pressure-sensitive adhesive is generally from about 1 to about 100 µm, preferably from 5 to 50 µm.

A silicone, long-chain alkyl, or fluorine treatment with a low-adhesion material may also be performed to form a release treatment layer on the surface of the base film of the surface protective film, opposite to its surface on which the pressure-sensitive adhesive layer is provided.

<Other Optical Layers>

For practical use, the polarizing film (including the one-side-protected polarizing film and the pressure-sensitive-adhesive-layer-attached polarizing film) of the invention may be laminated with any other optical layer or layers to form an optical film. As a non-limiting example, such an optical layer or layers may be one or more optical layers that have ever been used to form liquid crystal display devices or other devices, such as a reflector, a transflector, a retardation plate (including a wavelength plate such as a half or quarter wavelength plate), or a viewing angle compensation film. Particularly preferred is a reflective or transflective polarizing film including a laminate of the one-side-protected polarizing film of the invention and a reflector or a transflector, an elliptically or circularly polarizing film including a laminate of the polarizing film of the invention and a retardation plate, a wide viewing angle polarizing film including a laminate of the polarizing film of the invention and a viewing angle compensation film, or a polarizing film including a laminate of the polarizing film of the invention and a brightness enhancement film.

The optical film including a laminate of the above optical layer and the polarizing film (including the one-side-protected polarizing film and the pressure-sensitive-adhesive-layer-attached polarizing film) of the invention may be formed by a method of stacking them one by one, for example, in the process of manufacturing a liquid crystal display device. However, the optical film should be formed by stacking them in advance, which is superior in quality stability or assembling workability and thus advantageous in facilitating the process of manufacturing liquid crystal display devices or other devices. In the lamination, any appropriate bonding means such as a pressure-sensitive adhesive layer may be used. When the pressure-sensitive-adhesive-layer-attached polarizing film and any other optical film are bonded together, their optical axes may be each aligned at an appropriate angle, depending on the desired retardation properties or other desired properties.

The polarizing film (including the one-side-protected polarizing film and the pressure-sensitive-adhesive-layer-attached polarizing film) of the invention, or the optical film of the invention is preferably used to form various image display devices such as liquid crystal display devices and organic EL display devices. Liquid crystal display devices may be formed according to conventional techniques. Specifically, a liquid crystal display device may be typically formed according to any conventional techniques by appropriately assembling a liquid crystal cell, pressure-sensitive-adhesive-layer-attached polarizing films or optical films, and optional components such as a lighting system, incorporating a driving circuit, and performing other processes, except that the polarizing film (including the one-side-protected polarizing film and the pressure-sensitive-adhesive-layer-attached polarizing film) of the invention, or the optical film of the invention is used. The liquid crystal cell to be used may also be of any type, such as IPS type or VA type. The invention is particularly suitable for IPS type.

Any desired liquid crystal display device may be formed, such as a liquid crystal display device including a liquid crystal cell and the polarizing film (including the one-side-protected polarizing film and the pressure-sensitive-adhesive-layer-attached polarizing film) of the invention, or the optical film of the invention placed on one or both sides of the liquid crystal cell, or a liquid crystal display device further including a backlight or a reflector in the lighting system. In such a case, the polarizing film (including the one-side-protected polarizing film and the pressure-sensitive-adhesive-layer-attached polarizing film) of the invention, or the optical film of the invention may be placed on one or both sides of the liquid crystal cell. When the polarizing films (including the one-side-protected polarizing films and the pressure-sensitive-adhesive-layer-attached polarizing films) of the invention, or the optical films of the invention are provided on both sides, they may be the same or different. The process of forming the liquid crystal display device may also include placing, at an appropriate position or positions, one or more layers of an appropriate component such as a diffusion plate, an antiglare layer, an anti-reflection film, a protective plate, a prism array, a lens array sheet, a light diffusion plate, or a backlight.

EXAMPLES

Hereinafter, the invention will be more specifically described with reference to examples. It will be understood that the examples shown below are not intended to limit the invention. In each example, "parts" and "%" are all by weight. Unless otherwise specified below, the conditions of standing at room temperature include 23° C. and 65% RH in all cases.

<Measurement of Viscosity>

The viscosity of each aqueous solution (coating liquid) as a liquid material was measured using Model R85 Viscometer RE85L (manufactured by TOKI SANGYO CO., LTD.) under the conditions below.

Measurement temperature: 25° C.
Rotation speed: 0.5 to 100 rpm
Cone rotor: 1° 34'×R24

<Transparent Resin Layer-Forming Material>

(Polyvinyl Alcohol-Based, Layer-Forming Material (PVA-A))

An aqueous solution (coating liquid) with a solid concentration of 4% by weight and a viscosity of 60 mPa·s was prepared by dissolving a polyvinyl alcohol resin with a polymerization degree of 2,500 and a saponification degree of 99.7 mol % in pure water.

(Polyvinyl Alcohol-Based, Layer-Forming Material (PVA-B))

An aqueous solution (coating liquid) with a solid concentration of 4% by weight and a viscosity of 60 mPa·s was prepared by dissolving a polyvinyl alcohol resin with a polymerization degree of 500 and a saponification degree of 96.0 mol % in pure water.

(Polyvinyl Alcohol-Based, Layer-Forming Material (PVA-C))

An aqueous solution (coating liquid) with a solid concentration of 8% by weight and a viscosity of 1,500 mPa·s was prepared by dissolving a polyvinyl alcohol resin with a polymerization degree of 2,500 and a saponification degree of 99.7 mol % in pure water.

(Acrylic, Layer-Forming Material A (Solvent-Free))

A coating liquid with a viscosity of 20 mPa·s was prepared by mixing the following materials at 50° C. and stirring them for 1 hour.

| | |
|---|---|
| N-hydroxyethylacrylamide (HEAA (trade name) manufactured by KOHJIN Film & Chemicals Co., Ltd.) | 20 parts |
| Urethane acrylate (UV-1700B (trade name) manufactured by The Nippon Synthetic Chemical Industry Co., Ltd.) | 80 parts |
| Photo-radical polymerization initiator (2-methyl-1-(4-methylthiophenyl)-2-morpholinopropan-1-one (IRGACURE 907 (trade name) manufactured by BASF)) | 3 parts |
| Photosensitizer (diethyl thioxanthone (KAYACURE DETX-S (trade name) manufactured by Nippon Kayaku Co., Ltd.)) | 2 parts |

(Acrylic, Layer-Forming Material B (Solvent-Based))

A coating liquid with a viscosity of 10 mPa·s was prepared by adding methyl ethyl ketone in the preparation of acrylic, layer-forming material A shown above. In the preparation of acrylic, layer-forming material B, the addition of methyl ethyl ketone was so controlled that the content of acrylic, layer-forming material A in the solution was 40%.

(Acrylic, Layer-Forming Material C (Water-Based))

An aqueous solution (coating liquid) with a solid concentration of 3% and a viscosity of 10 mPa·s was prepared by adding 900 parts of pure water to 100 parts of JURYMER FC-80 (manufactured by TOAGOSEI CO., LTD.).

(Composition of Epoxy-Based, Layer-Forming Material A (Solvent-Free))

A coating liquid with a viscosity of 10 mPa·s was prepared by mixing the following materials at 50° C. and stirring them for 1 hour.

3',4'-epoxycyclohexylmethyl 3,4-epoxycyclohexanecarboxylate (CELLOXIDE 2021P (trade name) manufactured by DAICEL CORPORATION) 100 parts Photo-cationic polymerization initiator (4-(phenylthio) phenyldiphenylsulfonium hexafluorophosphate (CPI-100P (trade name) manufactured by SAN-APRO LTD.) 1 part <Protective Film (Acrylic) and Adhesive>

The adhesion facilitation-treated surface of a lactone ring structure-containing (meth)acrylic resin film with a thickness of 40 µm was subjected to a corona treatment. The corona-treated film was used as a protective film.

An ultraviolet-curable adhesive for use on the protective film (acrylic) was prepared by mixing 40 parts by weight of N-hydroxyethylacrylamide (HEAA), 60 parts by weight of acryloylmorpholine (ACMO), and 3 parts by weight of a photo-initiator IRGACURE 819 (manufactured by BASF).

<Protective Film (TAC) and Adhesive>

An 80-µm-thick triacetylcellulose film (TD80UL manufactured by FUJIFILM Corporation) was used as a protective film.

An aqueous solution with an adjusted solid concentration of 3.7% was prepared for use on the protective film (TAC) by dissolving 100 parts of an acetoacetyl group-containing, polyvinyl alcohol-based resin (1,200 in average degree of polymerization, 98.5 mol % in saponification degree, 5 mol % in acetoacetylation degree) and 50 parts of methylolmelamine in pure water under conditions at a temperature of 30° C. An aqueous adhesive solution was prepared by adding 18 parts of an aqueous alumina colloidal solution (15 nm in average particle size, 10% in solid concentration, positive charge) to 100 parts of the aqueous solution.

Example 1

(Step 1: Preparing Laminate (a)>

A long, amorphous, isophthalic acid-copolymerized polyethylene terephthalate (PET) film (NOVACLEAR (trade name) manufactured by Mitsubishi Chemical Corporation, 100 μm in thickness) with a water absorption of 0.75% and a Tg of 75° C. was used as a carrier film.

A corona treatment was performed on one surface of the carrier film. An aqueous solution containing 90 parts by weight of polyvinyl alcohol (4,200 in polymerization degree, 99.2 mol % in saponification degree) and 10 parts by weight of acetoacetyl-modified PVA (Gohsefimer Z200 (trade name) manufactured by The Nippon Synthetic Chemical Industry Co., Ltd., 1,200 in polymerization degree, 4.6% in acetoacetyl modification degree, 99.0 mol % or more in saponification degree) was applied to the corona-treated surface of the carrier film at 60° C. and dried to form a 10-μm-thick PVA-based resin layer (coating type), so that a laminate (a') was formed.

In an oven at 120° C., the resulting laminate (a') was subjected to free-end uniaxial stretching to 1.8 times in the longitudinal direction between rolls at different peripheral speeds (auxiliary in-air stretching).

Subsequently, the laminate was immersed in an insolubilization bath (an aqueous boric acid solution obtained by adding 4 parts by weight of boric acid to 100 parts by weight of water) at a temperature of 30° C. for 30 seconds (insolubilization).

Subsequently, the laminate was immersed in a dyeing bath (an aqueous iodine solution obtained by adding 0.2 parts by weight of iodine and 1.0 part by weight of potassium iodide to 100 parts by weight of water) at a temperature of 30° C. for 60 seconds (dyeing).

Subsequently, the laminate was immersed in a crosslinking bath (an aqueous boric acid solution obtained by adding 3 parts by weight of potassium iodide and 3 parts by weight of boric acid to 100 parts by weight of water) at a temperature of 30° C. for 30 seconds (crosslinking).

The laminate was then uniaxially stretched in the longitudinal direction between rolls at different peripheral speeds while it was immersed in an aqueous boric acid solution (an aqueous solution obtained by adding 4 parts by weight of boric acid and 5 parts by weight of potassium iodide to 100 parts by weight of water) at a temperature of 70° C. (in-water stretching). In this step, the stretch ratio was so controlled that the resulting polarizer had a thickness of 5 μm.

The laminate was then immersed in a cleaning bath (an aqueous solution obtained by adding 4 parts by weight of potassium iodide to 100 parts by weight of water) at a temperature of 30° C. (cleaning).

The resulting product was a laminate (a) including the carrier film and a 5-μm-thick polarizer provided thereon.

(Step 4: Stacking Protective Film to Form Carrier Film-Attached One-Side-Protected Polarizing Film A')

Subsequently, the protective film (acrylic) was bonded to the surface of the polarizer of the laminate (a) with the ultraviolet-curable adhesive being applied to the surface in such a manner as to form a 1-μm-thick adhesive layer after curing. Ultraviolet rays were then applied as active energy rays to cure the adhesive. The ultraviolet rays were applied using the following conditions: gallium-containing metal halide lamp; irradiator, Light Hammer 10 manufactured by Fusion UV Systems, Inc.; valve, V valve; peak illuminance, 1, 600 mW/cm$^2$; total dose, 1,000/mJ/cm$^2$ (wavelength 380-440 nm). The illuminance of the ultraviolet rays was measured with Sola-Check System manufactured by Solatell Ltd.

Carrier film-attached one-side-protected polarizing film A' was prepared as described above. The optical properties of resulting carrier film-attached one-side-protected polarizing film A' were as follows: transmittance 42.8%, polarization degree 99.99%.

(Step 2: Peeling Off Carrier Film)

Subsequently, the carrier film was peeled off from carrier film-attached one-side-protected polarizing film A', so that one-side-protected polarizing film A was obtained.

(Step 3: Producing Transparent Resin Layer-Attached One-Side-Protected Polarizing Film B)

Using a wire bar, the polyvinyl alcohol-based, layer-forming material (PVA-A) adjusted to 25° C. was applied as a transparent resin layer-forming material to the polarizer surface of one-side-protected polarizing film A, from which the carrier film had been peeled off, (the surface of the polarizer opposite to its surface provided with the protective film), in such a manner that a 1-μm-thick coating could be formed after drying, and then dried with hot air at 85° C. for 25 seconds, so that transparent resin layer-attached one-side-protected polarizing film B was obtained.

Examples 2 to 15 and Comparative Examples 1 to 4

Transparent resin layer-attached one-side-protected polarizing films B were produced as in Example 1, except that the material for use in each step, the thickness, means for forming each layer, and other conditions were changed as shown in Table 1.

As for Table 1, the carrier film used in the step (1) of Examples 3 and 4 was a product obtained by placing pressure-sensitive adhesive layer X (shown below) on a long, amorphous, isophthalic acid-copolymerized polyethylene terephthalate (PET) film (NOVACLEAR (trade name) manufactured by Mitsubishi Chemical Corporation, 38 μm in thickness) with a water absorption of 0.75% and a Tg of 75° C. The pressure-sensitive adhesive layer of the pressure-sensitive adhesive sheet prepared by the method described below was transferred and used as pressure-sensitive adhesive layer X. In the step (1), a PVA-based resin layer was formed on or a PVA film was bonded to the pressure-sensitive adhesive layer to form the laminate (a').

<Formation of Pressure-Sensitive Adhesive Layer X>

A four-necked flask equipped with a stirring blade, a thermometer, a nitrogen gas inlet tube, a condenser, and a dropping funnel was charged with 96 parts of 2-ethylhexyl acrylate (2EHA), 4 parts of 2-hydroxyethyl acrylate (HEA), 0.2 parts of 2,2'-azobisisobutyronitrile as a polymerization initiator, and 150 parts by weight of ethyl acetate. While being gently stirred with nitrogen gas being introduced into the flask, the mixture was subjected to polymerization reaction for 6 hours with the temperature kept at around 65° C. in the flask, so that an acryl-based polymer (a) solution (40%) was obtained. The acryl-based polymer (a) had a glass transition temperature of −68° C., which was calculated from the Fox equation, and a weight average molecular weight of 550,000.

On the other hand, a four-necked flask equipped with a stirring blade, a thermometer, a nitrogen gas inlet tube, a condenser, and a dropping funnel was charged with 100 parts by weight of toluene, 40 parts of dicyclopentanyl methacrylate (DCPMA) (FA-513M (trade name) manufactured by Hitachi Chemical Company, Ltd.), 60 parts of methyl methacrylate (MMA), and 3.5 parts of methyl thioglycolate as a chain transfer agent. After the mixture was stirred under a nitrogen atmosphere at 70° C. for 1 hour, 0.2 parts by weight of azobisisobutyronitrile as a thermal polymerization initiator was added to the mixture. The mixture was allowed to react at 70° C. for 2 hours, then at 80° C. for 4 hours, and then at 90° C. for 1 hour. Resulting (meth)acryl-based polymer 1 had a glass transition temperature of 130° C., which was calculated from the Fox equation, and a weight average molecular weight of 4,300.

A pressure-sensitive adhesive composition (1) was prepared by adding 1 part by weight of (meth)acryl-based polymer 1, 0.03 parts of lithium bis(trifluoromethanesulfonyl)imide (LiTFSI manufactured by Tokyo Chemical Industry Co., Ltd.) as an ionic compound, 0.5 parts of a polyoxyalkylene chain-containing organopolysiloxane (KF6004 (trade name) manufactured by Shin-Etsu Chemical Co., Ltd.) as a polyoxyalkylene chain-containing compound, 2.0 parts of CORONATE L (an ethyl acetate solution of trimethylolpropane/tolylene diisocyanate trimer adduct with a solid content of 75%, manufactured by Nippon Polyurethane Industry Co., Ltd.) as a crosslinking agent, and 3 parts by weight of an ethyl acetate solution of dioctyltin dilaurate as a crosslinking catalyst with a solid content of 1% to 500 parts of a solution obtained by diluting the (meth)acryl-based polymer (a) solution (35%) to 20% with ethyl acetate (100 parts of the (meth)acryl-based polymer (a)) and then mixing and stirring the materials at 25° C. for about 5 minutes.

(Preparation of Pressure-Sensitive Adhesive Sheet)

The pressure-sensitive adhesive composition (1) was applied to the surface of an antistatic treatment layer-attached polyethylene terephthalate film (Diafoil T100G38 (trade name) manufactured by Mitsubishi Plastics, Inc., 38 µm in thickness), opposite to its antistatically treated surface, and then heated at 130° C. for 2 minutes to form a 15-µm-thick pressure-sensitive adhesive layer. Subsequently, the silicone-treated surface of a release liner (a 20-µm-thick polyethylene terephthalate film with one silicone-treated surface) was bonded to the surface of the pressure-sensitive adhesive layer to form a pressure-sensitive adhesive sheet.

As for Table 1, the carrier film used in the step (1) of Examples 5 and 6 and Comparative Example 2 was a polyethylene (PE) film (Toretec 7332 manufactured by TORAY ADVANCED FILM Co., Ltd., 31 µm in thickness), and the carrier film used in the step (1) of Example 7 was a polypropylene (PP) film (TORAYFAN 2500H manufactured by Toray Industries, Inc., 60 µm in thickness).

As for Table 1, the method of forming the polarizer in the step (1) of Examples 2, 4, and 6 included bonding a 20-µm-thick polyvinyl alcohol film (film type) with an average degree of polymerization of 2,400 and a saponification degree of 99.9 mol % to the carrier film, instead of forming the PVA-based resin layer (coating type) in Example 1, in order to form the laminate (a'). In Examples 2, 4, and 6, the resulting laminate (a') was processed similarly to Example 1 to form the laminate (a) in which the polarizer had a thickness of 7 µm after the stretching.

As for Table 1, the step (4) of Examples 5 and 6 included bonding the protective film (TAC) to the surface of the polarizer with the aqueous adhesive solution. The bonding of the protective film (TAC) was followed by drying at 50° C. for 5 minutes. The thickness of the adhesive layer was controlled to be 0.1 µm after drying.

As for Table 1, when the polyvinyl alcohol-based, layer-forming material was used as the transparent resin layer-forming material, the step (3) was performed using the heating time, the heating temperature, and the thickness shown in Table 1. On the other hand, when acryl-based, layer-forming material A or epoxy, layer-forming material A was used as the transparent resin layer-forming material (Examples 11 and 14), the layer-forming material was applied with a wire bar coater to form a 5-µm-thick coating, which was then irradiated with active energy rays under a nitrogen atmosphere to form transparent resin layer-attached one-side-protected polarizing film B. In this case, visible rays (gallium-containing metal halide lamp) were applied as active energy rays using the following conditions: irradiator, Light Hammer 10 manufactured by Fusion UV Systems, Inc.; valve, V valve; peak illuminance, 1,600 mW/cm$^2$; total dose, 1,000/mJ/cm$^2$ (wavelength 380-440 nm). The illuminance of the visible rays was measured using Sola-Check System manufactured by Solatell Ltd.

When acryl-based, layer-forming material B (solvent-based) was used as the transparent resin layer-forming material (Example 12), the transparent resin layer was formed by a process including drying the applied material in an oven at 60° C. for 1 second, then removing the solvent from the material, and irradiating the material with active energy rays under a nitrogen atmosphere similarly to the above.

When acryl-based, layer-forming material C (water-based) was used as the transparent resin layer-forming material (Example 13), the transparent resin layer was formed by drying the applied material in an oven at 90° C. for 60 seconds.

In Comparative Examples 1 and 2, the step (3) (forming the transparent resin layer) was not performed.

In Comparative Example 3, only water was applied and subjected to drying, instead of forming the transparent resin layer.

In Comparative Example 4, the step (3) (forming the transparent resin layer) was performed with a thickness of 0.1 µm.

In Comparative Example 5, the carrier film was not used, which made the feeding impossible.

Transparent resin layer-attached one-side-protected polarizing films B or one-side-protected polarizing films A obtained in the examples and the comparative examples were evaluated as described below. Table 1 shows the results.

<Measurement of Compressive Elastic Modulus at 80° C.>

The compressive elastic modulus was measured using TI900 TriboIndenter (manufactured by Hysitron Inc.). A piece with a size of 10 mm×10 mm was cut from resulting transparent resin layer-attached, one-side-protected polarizing film B, then fixed on the support attached to TriboIndenter, and then subjected to the measurement of compressive elastic modulus by nanoindentation method. In the measurement, the position of the indenter was so adjusted that it would indent a portion at or near the center of the transparent resin layer. The measurement conditions are shown below.

Indenter used: Berkovich (triangular pyramid type)
Measurement method: single indentation measurement
Measurement temperature: 80° C.
Indentation depth setting: 100 nm <Single-Body Transmittance T and Polarization Degree P>

The single-body transmittance T and polarization degree P of the resulting one-side-protected polarizing film A was measured using an integrating sphere-equipped spectral transmittance meter (DOT-3C manufactured by Murakami Color Research Laboratory Co., Ltd.).

The polarization degree P is calculated from the formula below using the transmittance (parallel transmittance Tp) of a laminate of the same two polarizing films with their transmission axes parallel to each other and the transmittance (crossed transmittance Tc) of a laminate of the same two polarizing films with their transmission axes orthogonal to each other. Polarization degree P (%)={Tp−Tc)/(Tp+Tc)}$^{1/2}$×100

Each transmittance was expressed as the Y value, which was obtained through luminosity correction using the two-degree field (illuminant C) according to JIS Z 8701 when the transmittance for completely polarized light obtained through a Glan-Taylor prism polarizer was normalized to 100%.

<Feedability>

In the step (1), it was evaluated according to the criteria below whether the laminate (a') was able to be fed when subjected to in-water stretching (wet stretching step).

◯: The laminate (a') is feedable.

Δ: The laminate (a') is feedable but suffers from cracking at the end portion of the polarizer to such an extent that feeding is possible.

x: The laminate (a') is not feedable due to breakage.

<Durability (the Number of Occurrence of Light-Leakage Defects)>

Three 32-inch size pieces each with a long side along the absorption axis direction were cut from each of transparent resin layer-attached one-side-protected polarizing films B obtained in Examples 1 to 15 and Comparative Example 4 and one-side-protected polarizing films A obtained in Comparative Examples 1 to 3. Three 32-inch size pieces each with a short side along the absorption axis direction were also cut from each of polarizing films B and A. Subsequently, pressure-sensitive adhesive layer Y formed with a thickness of 20 μm by the method descried below was placed on the transparent resin layer surface of each of transparent resin layer-attached one-side-protected polarizing films B of Examples 1 to 15 and Comparative Example 4. Pressure-sensitive adhesive layer Y was also placed on the surface of each of one-side-protected polarizing films A of Comparative Examples 1 and 2, from which the carrier film had been peeled off. Pressure-sensitive adhesive layer Y was also placed on the water-coated surface of one-side-protected polarizing film A of Comparative Example 3. Each sample (pressure-sensitive-adhesive-layer-attached polarizing film) was obtained in this way. Using a laminator, the pressure-sensitive adhesive layer Y sides of the samples were bonded in crossed-Nicols arrangement to both sides of a 0.5-mm-thick non-alkali glass. Subsequently, the resulting laminate was autoclaved at 50° C. and 0.5 MPa for 15 minutes so that the samples were completely bonded to the non-alkali glass. In this way, three evaluation samples with 32-inch size for each example were prepared, in which transparent resin layer-attached one-side-protected polarizing films B or one-side-protected polarizing films A were bonded in crossed-Nicols arrangement. The evaluation samples were stored under each atmosphere at 80° C. (heating conditions) for 500 hours and then visually observed for whether and how many light-leakage defects occurred in each of the three evaluation samples. The total number of the defects was counted and evaluated according to the following criteria.

◯: No defect

Δ: 1 to 9 defects x: 10 or more defects

<Formation of Pressure-Sensitive Adhesive Layer Y>

A reaction vessel equipped with a condenser tube, a nitrogen gas inlet tube, a thermometer, and a stirrer was charged with 100 parts of butyl acrylate, 3 parts of acrylic acid, 0.1 parts of 2-hydroxyethyl acrylate, and 0.3 parts of 2,2'-azobisisobutyronitrile together with ethyl acetate, so that a solution was formed. Subsequently, the solution was allowed to react at 55° C. for 8 hours under stirring with nitrogen gas being blown into the solution, so that a solution containing an acryl-based polymer with a weight average molecular weight of 2,200,000 was obtained. Ethyl acetate was further added to the acryl-based polymer-containing solution to form an acryl-based polymer solution with an adjusted solid concentration of 30%.

A pressure-sensitive adhesive solution was prepared by adding 0.5 parts of a crosslinking agent (CORONATE L (trade name) manufactured by Nippon Polyurethane Industry Co., Ltd.) including an isocyanate group-containing compound as a main component and 0.075 parts of γ-glycidoxypropyltrimethoxysilane (KMB-403 (trade name) manufactured by Shin-Etsu Chemical Co., Ltd.) as a silane coupling agent in this order to the acryl-based polymer solution based on 100 parts of the solids of the acryl-based polymer solution. The pressure-sensitive adhesive solution was applied to the surface of a release sheet (separator) made of a release-treated polyethylene terephthalate film (38 μm in thickness) in such a manner that a 20-μm-thick coating could be formed after drying, and then dried to form pressure-sensitive adhesive layer Y.

TABLE 1

| | Step (1) Laminate (a) | | | | | | | | Step (2) | Step (3) | | | |
| | Carrier film | | | Polarizer | | | | Step (4) | Presence or absence of step | Transparent resin layer | | | |
| | | | Presence (thickness) or absence of pressure-sensitive adhesive layer | | | | | Protective film | | Coating liquid | | | |
| | Type | Thickness (μm) | | Formation method | Thickness after stretching | Transmittance (%) | Polarization degree (%) | Type | Thickness (μm) | Adhesive Type | Peeling off removable film | Type | Material PVA-based resin Type | Saponification degree (mol %) |
| Example 1 | PET | 100 μm | Absent | Coating type | 5 μm | 42.8% | 99.99% | Acrylic | 40 μm | UV-curable | Present | Water-based | PVA-A | 99.7% |

TABLE 1-continued

| | | | | | | | | | | | | | | | |
|---|---|---|---|---|---|---|---|---|---|---|---|---|---|---|---|
| Example 2 | PET | 100 μm | Absent | Film type | 7 μm | 42.8% | 99.99% | Acrylic | 40 μm | UV-curable | Present | Water-based | PVA-A | 99.7% |
| Example 3 | PET | 38 μm | 20 μm | Coating type | 5 μm | 42.8% | 99.99% | Acrylic | 40 μm | UV-curable | Present | Water-based | PVA-A | 99.7% |
| Example 4 | PET | 38 μm | 20 μm | Film type | 7 μm | 42.8% | 99.99% | Acrylic | 40 μm | UV-curable | Present | Water-based | PVA-A | 99.7% |
| Example 5 | PE | 31 μm | Absent | Coating type | 5 μm | 42.8% | 99.99% | TAC | 60 μm | Water-based | Present | Water-based | PVA-A | 99.7% |
| Example 6 | PE | 31 μm | Absent | Film type | 7 μm | 42.8% | 99.99% | TAC | 60 μm | Water-based | Present | Water-based | PVA-A | 99.7% |
| Example 7 | PP | 60 μm | Absent | Coating type | 5 μm | 42.8% | 99.99% | Acrylic | 40 μm | UV-curable | Present | Water-based | PVA-A | 99.7% |
| Example 8 | PET | 100 μm | Absent | Coating type | 5 μm | 42.8% | 99.99% | Acrylic | 40 μm | UV-curable | Present | Water-based | PVA-B | 96.0% |
| Example 9 | PET | 100 μm | Absent | Coating type | 5 μm | 42.8% | 99.99% | Acrylic | 40 μm | UV-curable | Present | Water-based | PVA-A | 99.7% |
| Example 10 | PET | 100 μm | Absent | Coating type | 5 μm | 42.8% | 99.99% | Acrylic | 40 μm | UV-curable | Present | Water-based | PVA-C | 99.7% |
| Example 11 | PET | 100 μm | Absent | Coating type | 5 μm | 42.8% | 99.99% | Acrylic | 40 μm | UV-curable | Present | Solvent-free | — | — |
| Example 12 | PET | 100 μm | Absent | Coating type | 5 μm | 42.8% | 99.99% | Acrylic | 40 μm | UV-curable | Present | Solvent-based | — | — |
| Example 13 | PET | 100 μm | Absent | Coating type | 5 μm | 42.8% | 99.99% | Acrylic | 40 μm | UV-curable | Present | Water-based | — | — |
| Example 14 | PET | 100 μm | Absent | Coating type | 5 μm | 42.8% | 99.99% | Acrylic | 40 μm | UV-curable | Present | Solvent-free | — | — |
| Example 15 | PET | 100 μm | Absent | Coating type | 7 μm | 42.8% | 99.99% | Acrylic | 40 μm | UV-curable | Present | Water-based | PVA-A | 99.7% |
| Comparative Example 1 | PET | 100 μm | Absent | Coating type | 5 μm | 42.8% | 99.99% | Acrylic | 40 μm | UV-curable | Present | — | — | — |
| Comparative Example 2 | PE | 31 μm | Absent | Coating type | 5 μm | 42.8% | 99.99% | Acrylic | 40 μm | UV-curable | Present | — | — | — |
| Comparative Example 3 | PET | 100 μm | Absent | Coating type | 5 μm | 42.8% | 99.99% | Acrylic | 40 μm | UV-curable | Present | Only water | — | — |
| Comparative Example 4 | PET | 100 μm | Absent | Coating type | 5 μm | 42.8% | 99.99% | Acrylic | 40 μm | UV-curable | Present | Water-based | PVA-A | 99.7% |
| Comparative Example 5 | Not used | — | — | Film type | 7 μm | — | — | — | — | — | — | — | — | — |

| | Step (3) Transparent resin layer | | | | | | | | Evaluations | | |
|---|---|---|---|---|---|---|---|---|---|---|---|
| | Coating liquid | | | | | | | | | Durability | |
| | Material | | Coating liquid viscosity (mPa·s) | Curing method | | | Compressive elastic modulus (GPa) | Thickness (μm) | Feedability | Number of occurrence of light-leakage defects | Damage-repairing effect |
| | PVA-based resin | Acrylic-based resin | | Solidification | | Curing | | | | | |
| | Polymerization degree | | | Heating time | Heating temperature | | | | | | |
| Example 1 | 2500 | — | 60 mPa·s | 25 sec | 85° C. | — | 8.1 GPa | 1 μm | ○ | 0 | ○ |
| Example 2 | 2500 | — | 60 mPa·s | 25 sec | 80° C. | — | 8.1 GPa | 0.3 μm | ○ | 2 | Δ |
| Example 3 | 2500 | — | 60 mPa·s | 25 sec | 85° C. | — | 8.1 GPa | 1 μm | ○ | 0 | ○ |
| Example 4 | 2500 | — | 60 mPa·s | 25 sec | 85° C. | — | 8.1 GPa | 1 μm | Δ | 0 | ○ |
| Example 5 | 2500 | — | 60 mPa·s | 25 sec | 85° C. | — | 8.1 GPa | 1 μm | Δ | 2 | Δ |
| Example 6 | 2500 | — | 60 mPa·s | 25 sec | 85° C. | — | 8.1 GPa | 1 μm | Δ | 3 | Δ |
| Example 7 | 2500 | — | 60 mPa·s | 25 sec | 85° C. | — | 8.1 GPa | 1 μm | ○ | 0 | ○ |

TABLE 1-continued

| | | | | | | | | | | | |
|---|---|---|---|---|---|---|---|---|---|---|---|
| Example 8 | 500 | — | 60 mPa·s | 25 sec | 85° C. | — | 5.4 GPa | 1 μm | ○ | 0 | ○ |
| Example 9 | 2500 | — | 60 mPa·s | 40 sec | 90° C. | — | 8.1 GPa | 3 μm | ○ | 0 | ○ |
| Example 10 | 2500 | — | 1500 mPa·s | 30 sec | 90° C. | — | 8.1 GPa | 1 μm | ○ | 2 | Δ |
| Example 11 | — | Acrylic A | 20 mPa·s | — | — | UV curing | 5.4 GPa | 5 μm | ○ | 4 | Δ |
| Example 12 | — | Acrylic B | 10 mPa·s | — | — | UV curing | 5.4 GPa | 5 μm | ○ | 2 | Δ |
| Example 13 | — | Acrylic C | 10 mPa·s | 60 sec | 90° C. | — | 3.0 GPa | 2 μm | ○ | 3 | Δ |
| Example 14 | — | Epoxy A | 10 mPa·s | — | — | UV curing | 3.6 GPa | 5 μm | ○ | 8 | Δ |
| Example 15 | 2500 | — | 60 mPa·s | 25 sec | 85° C. | — | 8.1 GPa | 1 μm | ○ | 0 | ○ |
| Comparative Example 1 | — | — | — | — | — | — | — | — | ○ | 20 | x |
| Comparative Example 2 | — | — | — | — | — | — | — | — | Δ | 50 | x |
| Comparative Example 3 | — | — | — | — | — | — | — | — | ○ | 20 | x |
| Comparative Example 4 | 2500 | — | 60 mPa·s | 25 sec | 85° C. | — | 8.1 GPa | 0.1 μm | ○ | 10 | x |
| Comparative Example 5 | — | — | — | — | — | — | — | — | x | — | — |

DESCRIPTION OF REFERENCE SIGNS

A' Carrier film-attached one-side-protected polarizing film
A One-side-protected polarizing film
B Transparent resin layer-attached one-side-protected polarizing film
C Pressure-sensitive-adhesive-layer-attached one-side-protected polarizing film (with transparent resin layer)
1 Polarizer
2 Protective film
3 Carrier film
4 Transparent resin layer
5 Pressure-sensitive adhesive layer

The invention claimed is:

1. A method for producing a polarizing film, the method comprising:
   providing a laminate comprising a carrier film and a polarizer,
   wherein the polarizer has a thickness of up to 10 μm,
   wherein the polarizer is formed on one surface of the carrier film and the polarizer comprises a polyvinyl alcohol-based resin;
   peeling off the carrier film from the laminate; and then
   applying a liquid material to a side of the polarizer from which the carrier film has been peeled off and then
   solidifying the liquid material to form a transparent resin layer with a thickness of 0.2 μm or more,
   wherein the liquid material contains a resin component dissolved or dispersed in water.

2. The method for producing a polarizing film according to claim 1, wherein the transparent resin layer has an 80° C. compressive elastic modulus of 0.1 GPa or more.

3. The method for producing a polarizing film according to claim 1, wherein the liquid material is an aqueous solution containing a polyvinyl alcohol-based resin.

4. The method for producing a polarizing film according to claim 1, wherein the liquid material has a viscosity of up to 1,000 mPa·s at 25° C.

5. The method for producing a polarizing film according to claim 1, wherein in the providing step, the laminate is obtained by performing at least a stretching step and a dyeing step.

6. The method for producing a polarizing film claim 1, further comprising forming a protective film on a polarizer side of the laminate,
   wherein the polarizing film is a one-side-protected polarizing film having the protective film provided on only one side of the polarizer.

7. The method for producing a polarizing film according to claim 1, wherein the polarizer has a single-body transmittance T and a polarization degree P representing optical properties satisfying the condition of the following formula: P>−(100.929T−42.4−1)×100 (provided that T<42.3) or P≥99.9 (provided that T≥42.3).

8. The method for producing a polarizing film according to claim 1, further comprising forming a pressure-sensitive adhesive layer on a side of the transparent resin layer.

9. The method for producing a polarizing film according to claim 1, further comprising:
   forming a protective film on a polarizer side of the laminate, and
   forming a pressure-sensitive adhesive layer on a side of the transparent resin layer,
   wherein the polarizing film produced is a one-side-protected polarizing film having the protective film provided on only one side of the polarizer.

10. The method for producing a polarizing film according to claim 1, wherein the carrier film is a thermoplastic resin film and has a thickness of 20 to 200 μm.

11. The method for producing a polarizing film according to claim 1, wherein the polarizer has a thickness of 2 μm to 8 μm.

12. The method for producing a polarizing film according to claim 6, wherein the protective film is selected from the group consisting of polyester-based polymers, cellulose-based polymers, acryl-based polymers, styrene-based polymers, and polycarbonate-based polymers.

* * * * *